United States Patent
Sharon et al.

(10) Patent No.: US 11,670,380 B2
(45) Date of Patent: Jun. 6, 2023

(54) TWO-SIDED ADJACENT MEMORY CELL INTERFERENCE MITIGATION

(71) Applicant: SanDisk Technologies LLC, Addison, TX (US)

(72) Inventors: Eran Sharon, Rishon Lezion (IL); Idan Alrod, Herzliya (IL); Alexander Bazarsky, Holon (IL)

(73) Assignee: SanDisk Technologies LLC, Addison, TX (US)

( * ) Notice: Subject to any disclaimer, the term of this patent is extended or adjusted under 35 U.S.C. 154(b) by 103 days.

(21) Appl. No.: 17/114,256

(22) Filed: Dec. 7, 2020

(65) Prior Publication Data

US 2022/0180940 A1 Jun. 9, 2022

(51) Int. Cl.
| | |
|---|---|
| *G11C 16/04* | (2006.01) |
| *G11C 16/26* | (2006.01) |
| *G11C 11/56* | (2006.01) |
| *G11C 16/08* | (2006.01) |
| *G11C 16/10* | (2006.01) |
| *G11C 16/34* | (2006.01) |
| *H01L 23/00* | (2006.01) |
| *H01L 27/11582* | (2017.01) |
| *H01L 25/065* | (2023.01) |

(52) U.S. Cl.
CPC .......... *G11C 16/26* (2013.01); *G11C 11/5671* (2013.01); *G11C 16/0483* (2013.01); *G11C 16/08* (2013.01); *G11C 16/10* (2013.01); *G11C 16/3459* (2013.01); *H01L 24/08* (2013.01); *H01L 25/0657* (2013.01); *H01L 27/11582* (2013.01); *H01L 2224/08145* (2013.01); *H01L 2225/06506* (2013.01); *H01L 2225/06562* (2013.01); *H01L 2924/1431* (2013.01); *H01L 2924/14511* (2013.01)

(58) Field of Classification Search
CPC . G11C 16/26; G11C 11/5671; G11C 16/0483; G11C 16/08; G11C 16/10; G11C 16/3459
See application file for complete search history.

(56) References Cited

U.S. PATENT DOCUMENTS

| | | | |
|---|---|---|---|
| 7,652,929 | B2 | 1/2010 | Li |
| 7,876,611 | B2 | 1/2011 | Dutta et al. |

(Continued)

*Primary Examiner* — Uyen Smet
(74) *Attorney, Agent, or Firm* — Vierra Magen Marcus LLP

(57) ABSTRACT

Technology for two-sided adjacent memory cell interference mitigation in a non-volatile storage system is disclosed. During reading of target memory cells, the storage system applies a suitable magnitude read pass voltage to a first unselected word line adjacent to a target word line to compensate for interference from adjacent cells on the first unselected word line while applying a suitable magnitude read reference voltage to the target word line to compensate for interference from adjacent cells on a second unselected word line on the other side of the target word line. The read pass voltage may compensate for interference due to charge being added to when programming cells on the first unselected word line after programming the target cells. The read reference voltage may compensate for interference due to charge movement near the target cells that results from charge stored in the cells on the second unselected word line.

18 Claims, 25 Drawing Sheets

(56) References Cited

U.S. PATENT DOCUMENTS

| | | | |
|---|---|---|---|
| 8,051,240 B2 | 11/2011 | Dutta et al. | |
| 8,400,839 B2 | 3/2013 | Li | |
| 8,498,152 B2 | 7/2013 | Alrod et al. | |
| 9,721,652 B2 | 8/2017 | Puthenthermadam et al. | |
| 9,805,809 B1 | 10/2017 | Zhou et al. | |
| 10,541,035 B1 | 1/2020 | Lu et al. | |
| 2010/0329010 A1* | 12/2010 | Dong | G11C 16/3418 365/185.17 |
| 2013/0185598 A1* | 7/2013 | Haratsch | G11C 16/34 714/42 |
| 2014/0254262 A1* | 9/2014 | Chen | G11C 16/3427 365/185.12 |
| 2017/0140814 A1* | 5/2017 | Puthenthermadam | G11C 16/08 |

* cited by examiner

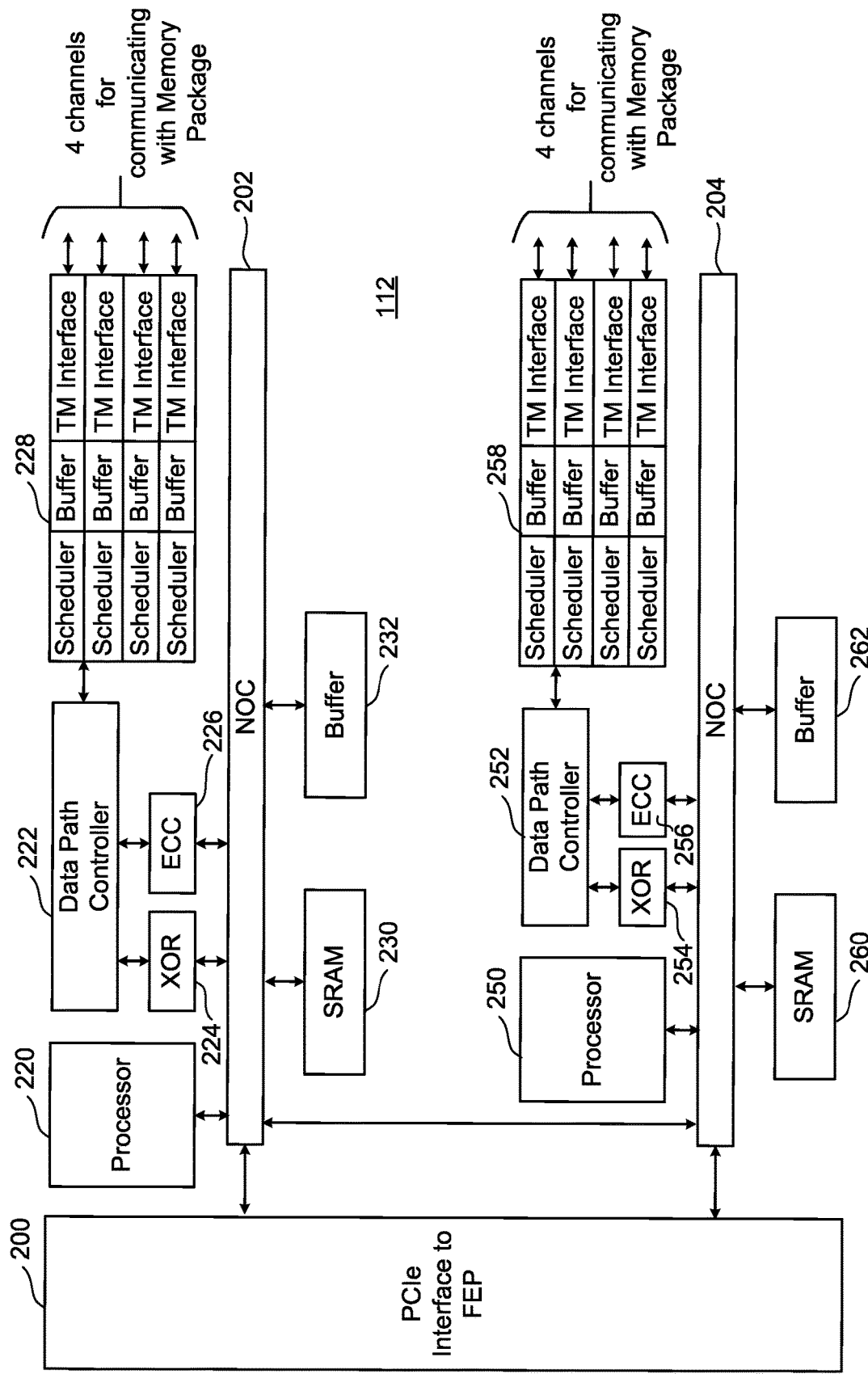

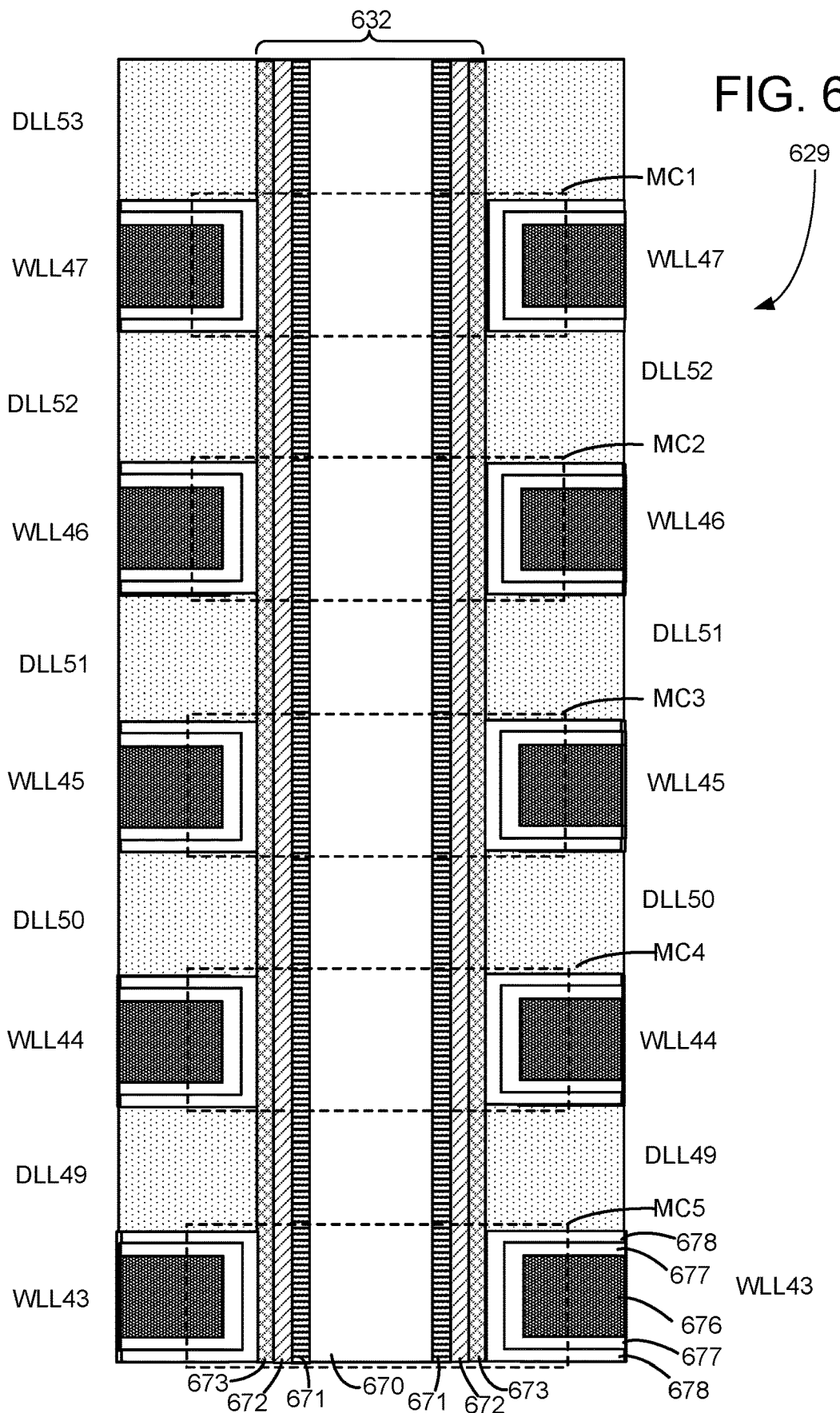

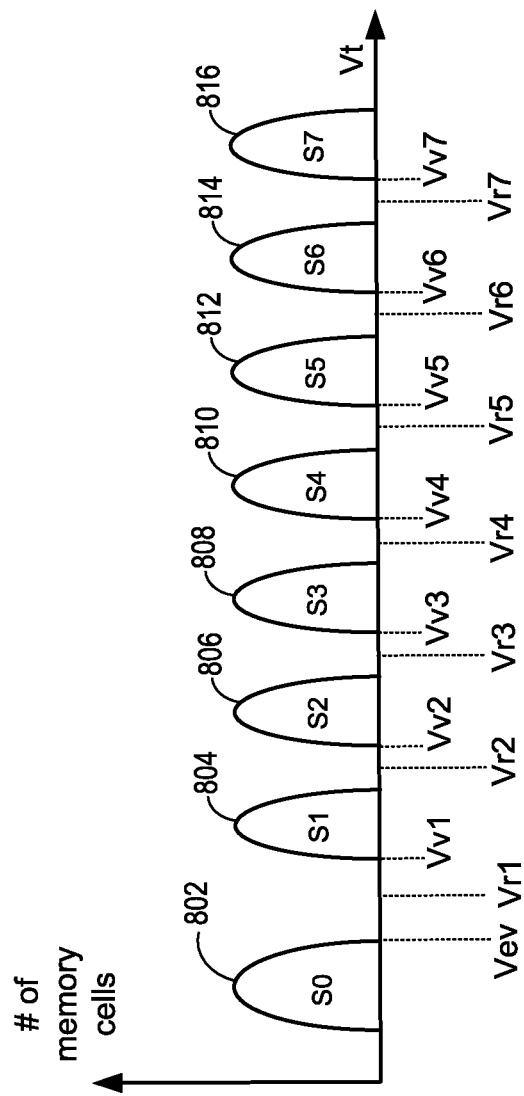

TWO-SIDED ADJACENT MEMORY CELL INTERFERENCE MITIGATION

BACKGROUND

The strong growth in demand for portable consumer electronic devices is driving the need for high-capacity storage devices. Non-volatile semiconductor memory devices (also referred to herein as "non-volatile storage systems" or "non-volatile memory systems"), such as flash memory, are widely used to meet the ever-growing demands on digital information storage and exchange. Their portability, versatility and rugged design, along with their high reliability and large capacity, have made such memory devices ideal for use in a wide variety of host electronic devices, including for example digital cameras, digital music players, video game consoles, PDAs, cellular telephones, and desktop, laptop, and notepad computers. Typically, the host electronic device provides power to the non-volatile storage system.

Non-volatile semiconductor memory devices contain non-volatile memory cells that may be programmed to store data. Typically, the memory cells are programmed to a number of data states. Using a greater number of data states allows for more bits to be stored per memory cell. For example, four data states may be used to store two bits per memory cell, eight data states may be used in order to store three bits per memory cell, 16 data states may be used to store four bits per memory cell, etc. To read the data back from the memory cells it is typical to use read reference voltages in order to determine what data state a memory cell is presently in.

In addition to the gains in capacity resulting from multi-state memory architectures, consumers have seen significant advantages as a result of a history of steadily scaling down the physical dimensions of memory cells. Smaller memory cells can be packed more densely on a given die area, allowing the user to access more memory capacity for the same price as an older memory technology. In order to achieve the advantage of higher memory capacity for a fixed die size, these smaller memory cells must be packed more closely together. Doing so, however, may result in greater interference of an adjacent memory cell on a target memory cell.

Once a memory cell has been programmed, it is important that its programming state can be read back with a high degree of reliability. However, the sensed programming state can sometimes vary from the intended programming state due to factors including interference from an adjacent memory cell. This interference from the adjacent memory cell increases if smaller memory cells are packed more closely together.

DESCRIPTION OF THE DRAWINGS

Like-numbered elements refer to common components in the different Figures.

FIG. 2A is a block diagram of one embodiment of a Back End Processor Circuit.

FIG. 6D depicts a cross sectional view of region 629 of FIG. 6C that includes a portion of vertical column 632.

FIG. 8A illustrates example threshold voltage distributions for the memory array when each memory cell stores three bits of data.

DETAILED DESCRIPTION

Figure 1A:
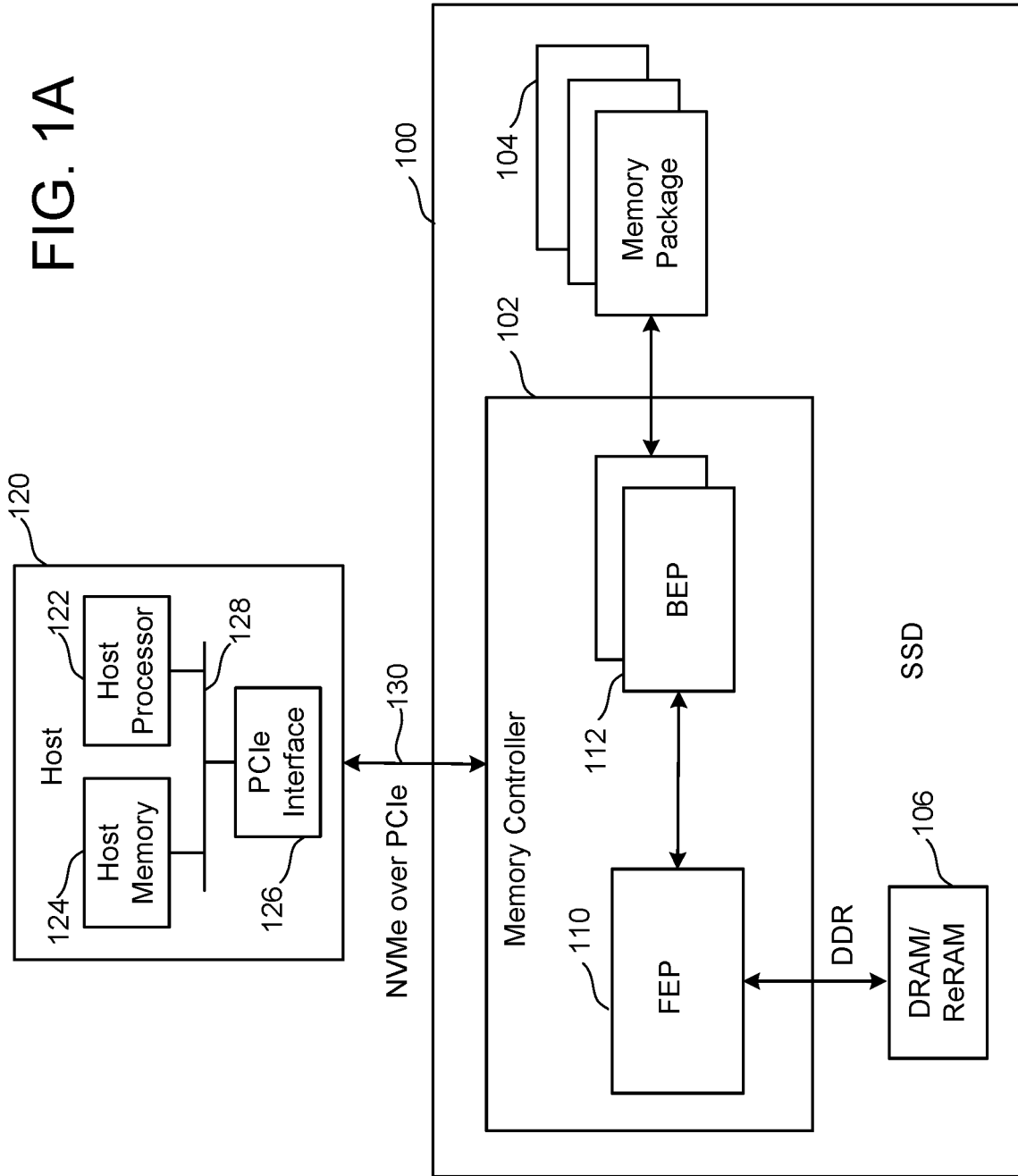
FIG. 1A is a block diagram of one embodiment of a storage system connected to a host.

The present technology will now be described with reference to the figures, which in embodiments, relate to two-sided adjacent memory cell interference mitigation in a non-volatile storage system. The basic unit of storage in non-volatile storage systems is a memory cell. A memory cell may be programmed to a data state by storing charge in the memory cell. For example, the threshold voltage of a NAND memory cell can be set to a target level by programming charge into a charge storage region such as charge trapping layer. The amount of charge stored in the charge trapping layer establishes the threshold voltage (Vt) of the memory cell.

Actual and/or apparent shifts in the Vt associated with a target memory cell can occur due to charge associated with one or more adjacent memory cells. To account for the actual and/or apparent shifts in Vt, different compensations may applied based on different possible conditions of adjacent cells on two sides of the target memory cell. Herein, an "adjacent memory cell" means a cell that is an immediate neighbor to a target memory cell. In some embodiments, the target memory cell and two adjacent memory cells are on the same NAND string. In some embodiments, the target memory cell is connected to a target word line, one adjacent cell is connected to a first adjacent word line and another adjacent cell is connected to a second adjacent word line. Herein, an "adjacent word line" means a word line that is an immediate neighbor to a target word line. In some embodiments, programming the memory cells occurs sequentially by word line. Hence, the programming order may be, for example, WLn−1, WLn, WLn+1, etc. For purpose of discussion, WLn may be referred to as the target word line.

In some cases, programming an adjacent memory cell after finishing programming a target memory cell can alter the apparent Vt of the target memory cell. The aforementioned interference may be referred to herein as near word line interference (NWI). NWI can shift the apparent Vt of the target memory cell due to the electric field introduced by charge injected into a charge trapping layer of the adjacent cell when programming the adjacent cell.

In some cases, the charge that is stored on an adjacent memory cell can alter the actual Vt of a target memory cell. The aforementioned interference may be referred to herein as lateral data retention (lateral DR). Lateral DR is the shifting of trapped electrons or holes from cell to cell or from cell to the area in between the cells. That shift happens in the charge trapping layer because electrons and holes can move around to a small extent in the charge trapping layer. Lateral DR depends on the amount of charge stored in the charge trapping layer of the adjacent memory cell. More charge (and hence higher Vt) results in a greater interference on the target memory cell.

An embodiment of a storage system compensates both for NWI and lateral DR. In an embodiment, the compensation for NWI is for adjacent memory cells that were programmed after programming of target memory cells to be read was completed. In an embodiment, the compensation for lateral DR is for adjacent memory cells for which programming was complete prior to completing programming of the target memory cells. Thus, when reading memory cells connected to a target word line, the storage system compensates for NWI for adjacent cells connected to a first adjacent word line and compensates for lateral DR for adjacent cells connected to a second adjacent word line.

An embodiment of a storage system compensates for lateral DR by applying a suitable magnitude read reference voltage to the target word line and compensates for NWI by applying a suitable magnitude read pass voltage to the aforementioned first adjacent word line. In an embodiment, the amount of compensation for lateral DR depends on the data state of an adjacent memory cell. Greater compensation for lateral DR may be applied when the adjacent cell has more stored charge, which may correspond to a higher Vt. In an embodiment, the amount of compensation for NWI depends on the data state of an adjacent memory cell. Greater compensation for NWI may be applied when the adjacent cell was programmed after programming of the target cell was complete.

Combined NWI compensation with lateral DR compensation improves Vt margin. Combined NWI compensation with lateral DR compensation reduces bit error rate (BER). NWI compensation may be especially useful to apply to adjacent memory cells that were programmed after programming of the target cells was complete. However, NWI compensation may be less useful for adjacent memory cells for which programming was completed prior to completing programming of the target cells. Thus, in embodiments, NWI compensation is only applied to the aforementioned first adjacent word line. Moreover, the lateral DR compensation, which is applied to the target word line, is based on the data states of the adjacent cells on the aforementioned second adjacent word line.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

FIG. 1A-6D describe one example of a storage system that can be used to implement the technology disclosed herein.

FIG. 1A is a block diagram of one embodiment of a storage system 100 connected to a host 120. Storage system 100 can implement the technology disclosed herein. Many different types of storage systems can be used with the technology disclosed herein. One example storage system is a solid state drive ("SSD"); however, other types of storage systems can also be used. Storage system 100 comprises a memory controller 102, memory package 104 for storing data, and local memory (e.g. DRAM/ReRAM) 106. Memory controller 102 comprises a Front End Processor Circuit (FEP) 110 and one or more Back End Processor Circuits (BEP) 112. In one embodiment FEP 110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the memory controller 102 is manufactured as a System on a Chip ("SoC"). FEP 110 and BEP 112 both include their own processors. In one embodiment, FEP 110 and BEP 112 work as a master slave configuration where the FEP 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory package 104 at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Memory controller 102 is one example of a control circuit.

In one embodiment, there are a plurality of memory packages 104. Each memory package 104 may contain one or more memory dies. In one embodiment, each memory die in the memory package 104 utilizes NAND flash memory (including two dimensional NAND flash memory and/or three dimensional NAND flash memory). In other embodiments, the memory package 104 can include other types of memory; for example, the memory package can include Phase Change Memory (PCM) memory.

In one embodiment, memory controller 102 communicates with host 120 using an interface 130 that implements NVM Express (NVMe) over PCI Express (PCIe). For working with storage system 100, host 120 includes a host processor 122, host memory 124, and a PCIe interface 126, which communicate over bus 128. Host memory 124 is the host's physical memory, and can be DRAM, SRAM, non-volatile memory or another type of storage. Host 120 is external to and separate from storage system 100. In one embodiment, storage system 100 is embedded in host 120.

Figure 1B:
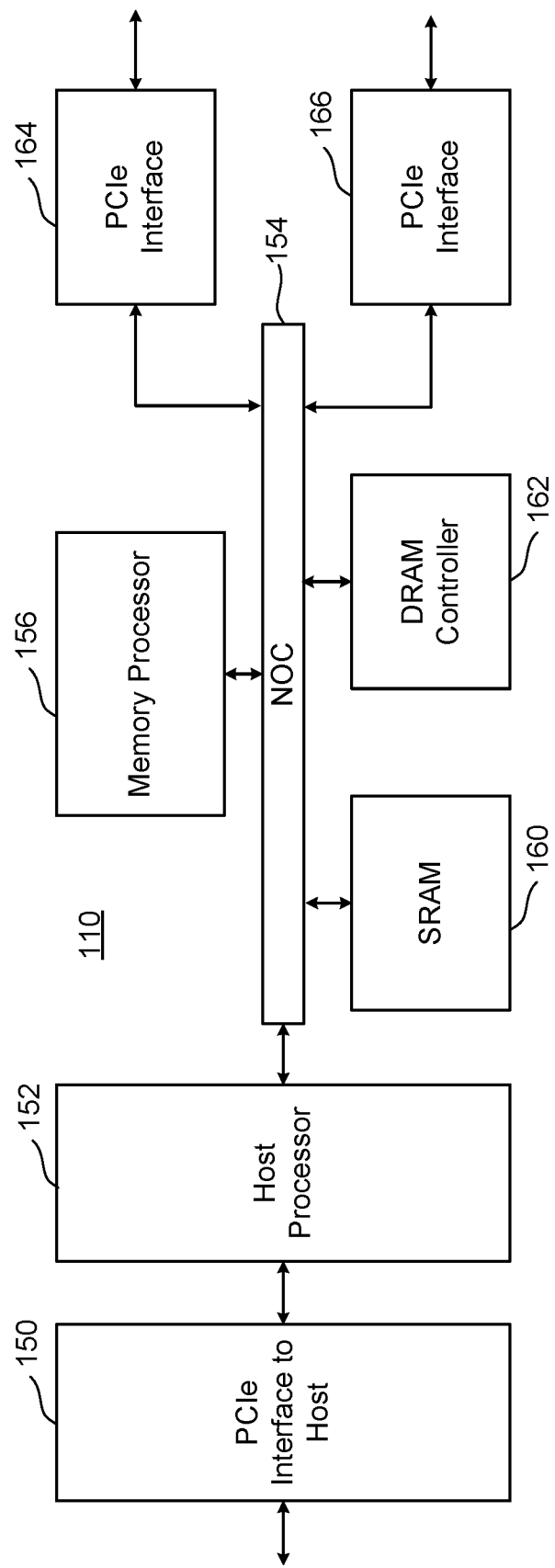
FIG. 1B is a block diagram of one embodiment of a Front End Processor Circuit.

FIG. 1B is a block diagram of one embodiment of FEP circuit 110. FIG. 1B shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use un-clocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, memory controller 102 includes two BEP circuits 112; therefore, there are two PCIe Interfaces 164/166. Each PCIe Interface communicates with one of the BEP circuits 112. In other embodiments, there can be more or fewer than two BEP circuits 112; therefore, there can be more than two PCIe Interfaces.

FIG. 2A is a block diagram of one embodiment of the BEP circuit 112. FIG. 2A shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254), an ECC engine (226/256).

The ECC engines 226/256 are used to perform error correction, as known in the art. Herein, the ECC engines 226/256 may be referred to as controller ECC engines. The XOR engines 224/254 are used to XOR the data so that data can be combined and stored in a manner that can be recovered in case there is a programming error. In an embodiment, the XOR engines 224/254 are able to recover data that cannot be decoded using ECC engine 226/256.

Data path controller 222 is connected to a memory interface 228 for communicating via four channels with integrated memory assemblies. Thus, the top NOC 202 is associated with memory interface 228 for four channels for communicating with integrated memory assemblies and the bottom NOC 204 is associated with memory interface 258 for four additional channels for communicating with integrated memory assemblies. In one embodiment, each memory interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254, ECC engines 226/256 can be implemented in software. The scheduler, buffer, and TM Interfaces are hardware circuits. In other embodiments, the memory interface (an electrical circuit for communicating with memory dies) can be a different structure than depicted in FIG. 2A. Additionally, controllers with structures different than FIGS. 1B and 2A can also be used with the technology described herein.

Figure 2B:
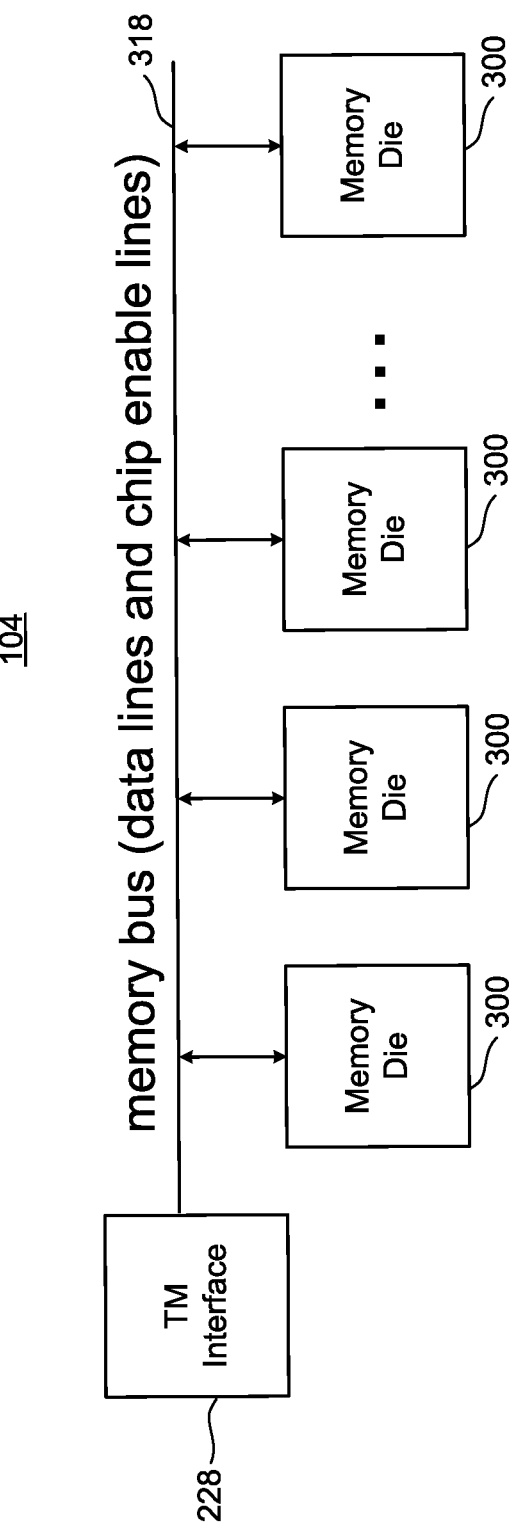
FIG. 2B is a block diagram of one embodiment of a memory package.

FIG. 2B is a block diagram of one embodiment of a memory package 104 that includes a plurality of memory dies 300 connected to a memory bus (data lines and chip enable lines) 322. The memory bus 322 connects to a Toggle Mode Interface 228 for communicating with the TM Interface of a BEP circuit 112 (see e.g., FIG. 2A). In some embodiments, the memory package can include a small controller connected to the memory bus and the TM Interface. In total, the memory package 104 may have eight or 16 memory die; however, other numbers of memory die can also be implemented. The technology described herein is not limited to any particular number of memory die.

Figure 3A:
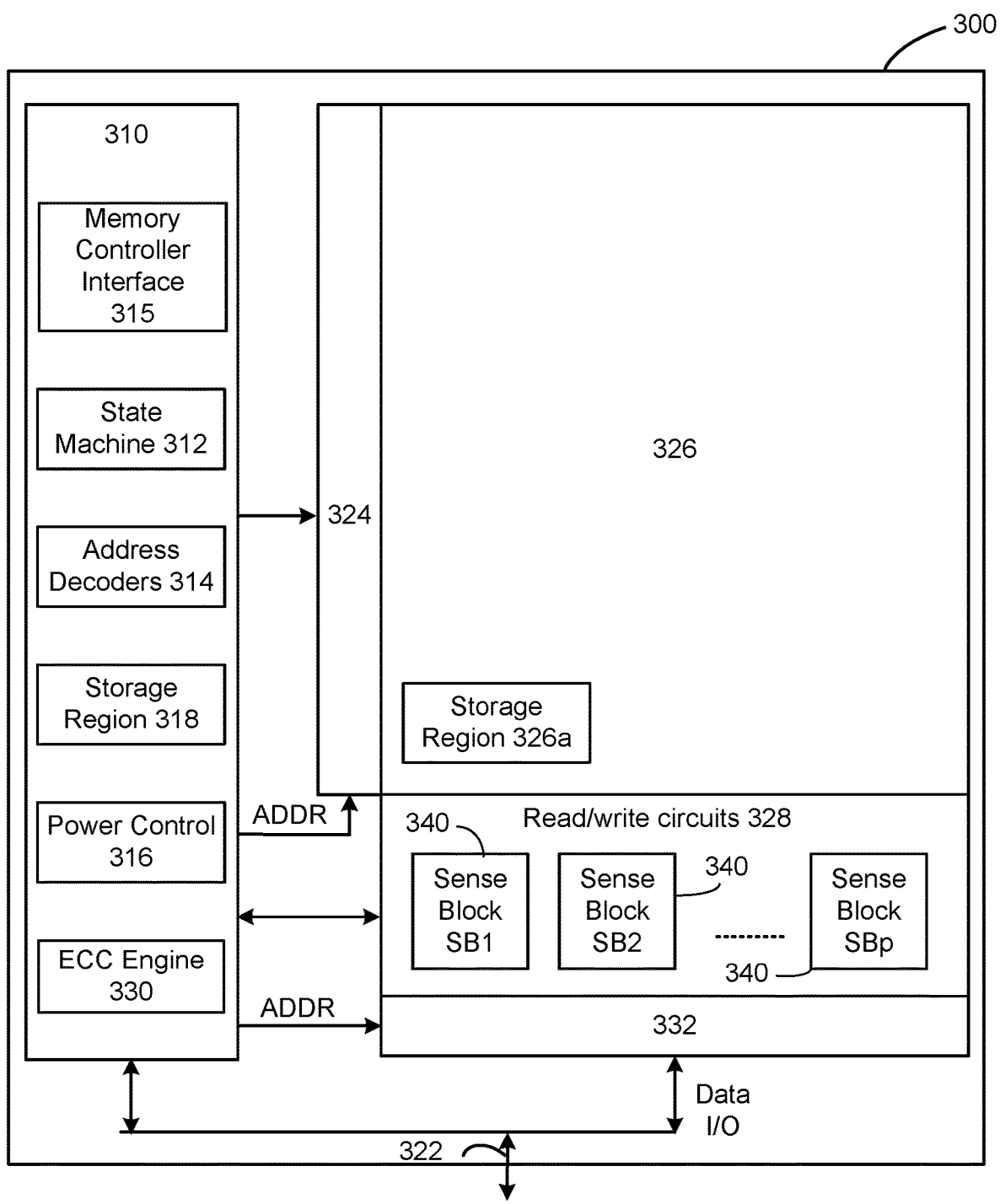
FIG. 3A is a functional block diagram of an embodiment of a memory die.

FIG. 3A is a functional block diagram of one embodiment of a memory die 300. Each of the one or more memory die 300 of FIG. 2B can be implemented as memory die 300 of FIG. 3A. The components depicted in FIG. 3A are electrical circuits. In one embodiment, each memory die 300 includes a memory structure 326, control circuitry 310, read/write circuits 328, and decoders 324/332, all of which are electrical circuits. Memory structure 326 is addressable by word lines via a row decoder 324 and by bit lines via a column decoder 332. The read/write circuits 328 include multiple sense blocks 340 including SB1, SB2, . . . , SBp (sensing circuitry) and allow a page (or multiple pages) of data in multiple memory cells to be read or programmed in parallel. In one embodiment, each sense block include a sense amplifier and a set of latches connected to the bit line. The latches store data to be written and/or data that has been read. The sense blocks include bit line drivers.

Commands and data are transferred between the controller 102 and the memory die 300 via memory controller interface 315 (also referred to as a "communication interface"). Memory controller interface 315 is an electrical interface for communicating with memory controller 102. Examples of memory controller interface 315 include a Toggle Mode Interface and an Open NAND Flash Interface (ONFI). Other I/O interfaces can also be used. For example, memory controller interface 315 may implement a Toggle Mode Interface that connects to the Toggle Mode interfaces of memory interface 228/258 for memory controller 102. In one embodiment, memory controller interface 315 includes a set of input and/or output (I/O) pins that connect to memory bus 322. In one embodiment, memory bus 322 connects to the memory controller 102 as part of the Toggle Mode Interface.

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, power control 316, a memory controller interface 315, and storage region 318. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, control circuitry 310 includes buffers such as registers, ROM fuses and other storage devices for storing default values such as base voltages, and other parameters. The default values and other parameters could be stored in a region of the memory structure 326 (e.g., structure parameter storage 326a). These default values may be updated from time to time.

The on-chip address decoder 314 provides an address interface between addresses used by controller 102 to the hardware address used by the decoders 324 and 332. Power control 316 controls the power and voltages supplied to the word lines and bit lines during memory operations. Power control 316 may include charge pumps for creating voltages.

Storage region 318 may be used to store parameters for operating the memory structure 326. Storage region 318 may include volatile or non-volatile memory. In some embodiments, the parameters include read reference voltages. In one embodiment, the storage region 318 contains a look-up-table that correlates SW to BER. The memory structure 326 has storage region 326a, which may also contain a copy of the parameters for operating the memory structure 326. In some embodiments, the parameters are copied from storage region 326a to storage region 318 when the memory die 300 is powered on.

For purposes of this document, control circuitry 310, alone or in combination with read/write circuits 328 and decoders 324/332, comprise a control circuit connected to memory structure 326. The control circuit is an electrical circuit that performs the functions described below in the flow charts. In other embodiments, the control circuit can consist only of controller 102 (or other controller), which is an electrical circuit in combination with software (e.g., firmware), that performs the functions described below in the flow charts. In one embodiment, the control circuit is the controller where the controller is an electrical circuit that does not use hardware. In another alternative, the control circuit comprises controller 102 and control circuitry 310 performing the functions described below in the flow charts. In another embodiment, the control circuit comprises state machine 312 (and/or a microcontroller and/or microprocessor) alone or in combination with controller 102. In another alternative, the control circuit comprises controller 102, control circuitry 310, read/write circuits 328 and decoders 324/332 performing the functions described below in the flow charts. In other embodiments, the control circuit comprises one or more electrical circuits that operate the non-volatile memory.

In one embodiment, memory structure 326 comprises a monolithic three-dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A storage device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a Ge$_2$Sb$_2$Te$_5$ alloy to achieve phase changes by electrically heating the phase change material. The doses of programming are electrical pulses of different amplitude and/or length resulting in different resistance values of the phase change material.

A person of ordinary skill in the art will recognize that the technology described herein is not limited to a single specific memory structure, but covers many relevant memory structures within the spirit and scope of the technology as described herein and as understood by one of ordinary skill in the art.

Figure 3B:
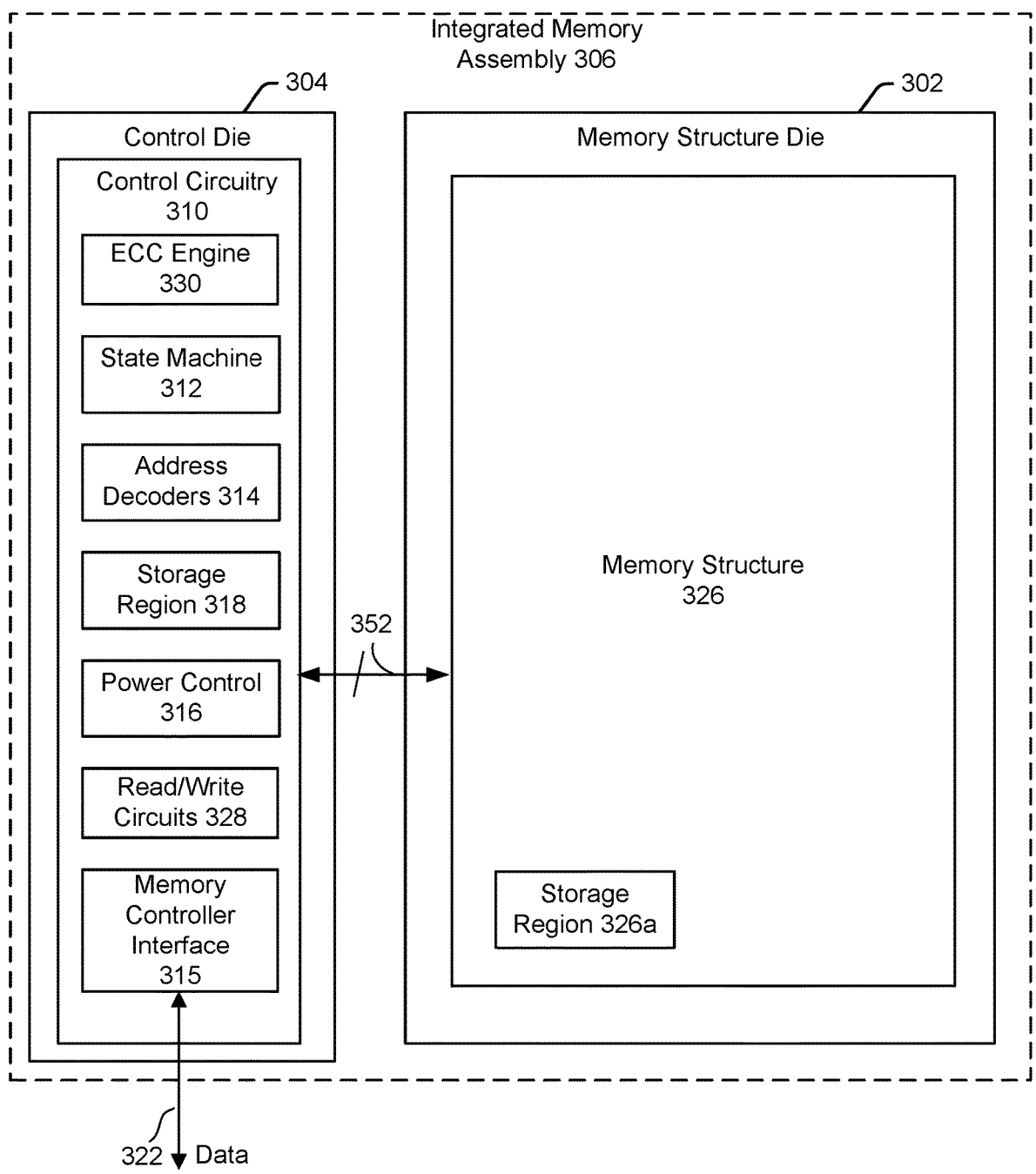
FIG. 3B is a functional block diagram of an embodiment of an integrated memory assembly.

FIG. 3B depicts a functional block diagram of one embodiment of an integrated memory assembly 306. The integrated memory assembly 306 may be used in a memory package 104 in storage system 100. In one embodiment, the integrated memory assembly 306 includes two types of semiconductor die (or more succinctly, "die"). Memory structure die 302 includes memory structure 326. Memory structure 326 may contain non-volatile memory cells. Control die 304 includes control circuitry 310. In some embodiments, the control die 304 is configured to connect to the memory structure 326 in the memory structure die 302. For example, the control circuitry 310 is configured to be connected to non-volatile memory cells in memory structure 326 in memory structure die 302. In some embodiments, the memory structure die 302 and the control die 304 are bonded together. The control circuitry 310 includes state machine 312, an address decoder 314, power control 316, memory controller interface 315, storage region 318, and ECC engine 330. Storage region may store parameters such as read reference voltages. The control circuitry 310 also includes read/write circuits 328. In another embodiment, a portion of the read/write circuits 328 are located on control die 304, and a portion of the read/write circuits 328 are located on memory structure die 302. The term apparatus as used herein may include, but is not limited to, memory die 300, control die 304, memory package 104, storage system 100, memory controller 102, or a host system 120 that includes a storage system 100.

The ECC engine 330 is configured to decode and error correct codewords. Herein, ECC engine 330 may be referred to as an on-die ECC engine. In one embodiment, the on-die ECC engine 330 is configured to encode data bits from the memory controller 102 into codewords that contain the data bits and parity bits. The control circuitry stores the codewords in the memory structure 326. In one embodiment, the on-die ECC engine 330 is configured to decode the codewords, which are read back from the memory structure 326.

Any subset of components in the control circuitry 310 of control die 304 can be considered a control circuit. In another alternative, the control circuit comprises controller 102 and control circuitry 310 of control die 304 performing the functions described below in the flow charts. The control circuit can include hardware only or a combination of hardware and software (including firmware). For example, a controller programmed by firmware is one example of a control circuit. A control circuit can include a processor, PGA (Programmable Gate Array, FPGA (Field Programmable Gate Array), ASIC (Application Specific Integrated Circuit), integrated circuit or other type of circuit.

Pathways 352 are pathways between one or more components in the control circuitry 310 and the memory structure on memory structure die 302. A pathway may be used to provide or receive a signal (e.g., voltage, current). A pathway includes an electrically conductive path. A pathway may include one or more of, but is not limited to, a bond pad, metal interconnect, via, transistor, electrically conducting material and other material that may transfer or carry an electrical signal. A pathway may be used to provide a read reference voltage from the power control 316 to a selected word line connected to memory cells being read in the memory structure 326.

In one embodiment, integrated memory assembly 306 includes a set of input and/or output (I/O) pins that connect to memory bus 322. Memory bus 322 is depicted as being connected to memory controller interface 315.

Figure 4A:
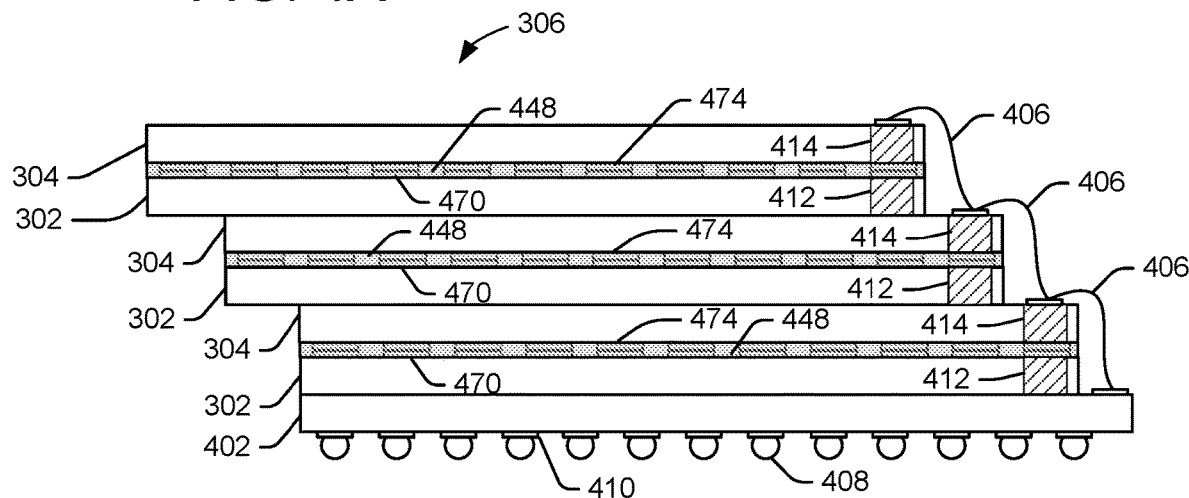
FIG. 4A depicts a side view of an embodiment of an integrated memory assembly stacked on a substrate.

In some embodiments, there is more than one control die 304 and more than one memory structure die 302 in an integrated memory assembly 306. In some embodiments, the integrated memory assembly 306 includes a stack of multiple control die 304 and multiple memory structure die 302. FIG. 4A depicts a side view of an embodiment of an integrated memory assembly 306 stacked on a substrate 402 (e.g., a stack comprising control dies 304 and memory structure dies 302). The integrated memory assembly 306 has three control dies 304 and three memory structure dies 302. In some embodiments, there are more than three memory structure dies 302 and more than three control die 304.

Each control die 304 is affixed (e.g., bonded) to at least one of the memory dies 302. Some of the bond pads 470, 474, are depicted. There may be many more bond pads. A space between two dies 302, 304 that are bonded together is filled with a solid layer 448, which may be formed from epoxy or other resin or polymer. This solid layer 448 protects the electrical connections between the dies 302, 304, and further secures the dies together. Various materials may be used as solid layer 448, but in embodiments, it may be Hysol epoxy resin from Henkel Corp., having offices in California, USA.

The integrated memory assembly 306 may for example be stacked with a stepped offset, leaving the bond pads at each level uncovered and accessible from above. Wire bonds 406 connected to the bond pads connect the control die 304 to the substrate 402. A number of such wire bonds may be formed across the width of each control die 304 (i.e., into the page of FIG. 4A).

A memory die through silicon via (TSV) 412 may be used to route signals through a memory structure die 302. A control die through silicon via (TSV) 414 may be used to route signals through a control die 304. The TSVs 412, 414 may be formed before, during or after formation of the integrated circuits in the semiconductor dies 302, 304. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 408 may optionally be affixed to contact pads 410 on a lower surface of substrate 402. The solder balls 408 may be used to electrically and mechanically couple the integrated memory assembly 306 to a host device such as a printed circuit board. Solder balls 408 may be omitted where the integrated memory assembly 306 is to be used as an LGA package. The solder balls 408 may form a part of the interface between the integrated memory assembly 306 and the memory controller 102.

Figure 4B:
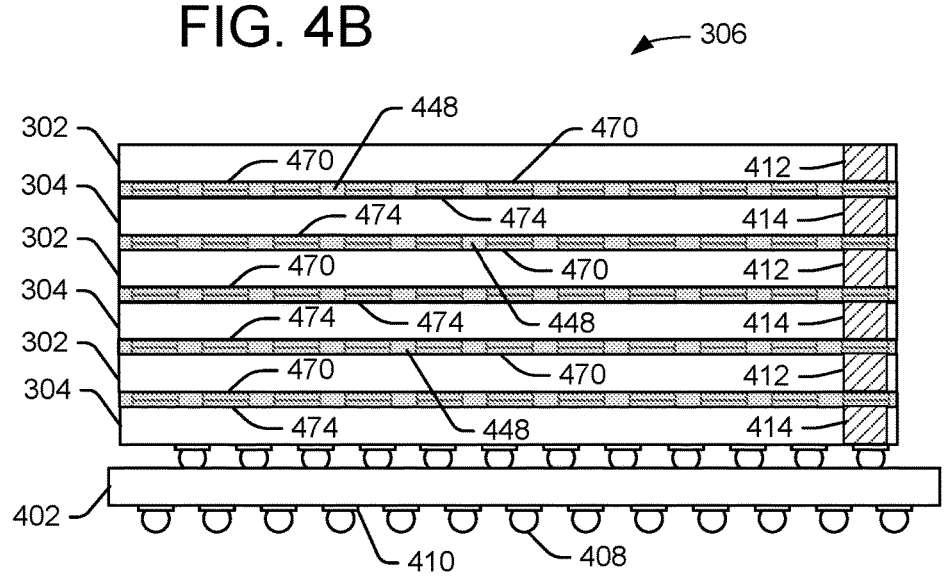
FIG. 4B depicts a side view of an embodiment of an integrated memory assembly stacked on a substrate.

FIG. 4B depicts a side view of an embodiment of an integrated memory assembly 306 stacked on a substrate 402. The integrated memory assembly 306 has three control die 304 and three memory structure die 302. In some embodiments, there are many more than three memory structure die 302 and many more than three control die 304. In this example, each control die 304 is bonded to at least one memory structure die 302. Optionally, a control die 304 may be bonded to two memory structure die 302.

Some of the bond pads 470, 474 are depicted. There may be many more bond pads. A space between two dies 302, 304 that are bonded together is filled with a solid layer 448, which may be formed from epoxy or other resin or polymer. In contrast to the example in FIG. 4A, the integrated memory assembly 306 in FIG. 4B does not have a stepped offset. A memory die through silicon via (TSV) 412 may be used to route signals through a memory structure die 302. A control die through silicon via (TSV) 414 may be used to route signals through a control die 304.

Solder balls 408 may optionally be affixed to contact pads 410 on a lower surface of substrate 402. The solder balls 408 may be used to electrically and mechanically couple the integrated memory assembly 306 to a host device such as a printed circuit board. Solder balls 408 may be omitted where the integrated memory assembly 306 is to be used as an LGA package.

As has been briefly discussed above, the control die 304 and the memory structure die 302 may be bonded together. Bond pads on each die 302, 304 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 302, 304. Where no such film is initially provided, a space between the dies may be under filled with an epoxy or other resin or polymer. The under-fill material may be applied as a liquid which then hardens into a solid layer. This under-fill step protects the electrical connections between the dies 302, 304, and further secures the dies together. Various materials may be used as under-fill material, but in embodiments, it may be Hysol epoxy resin from Henkel Corp., having offices in California, USA.

Figure 5:
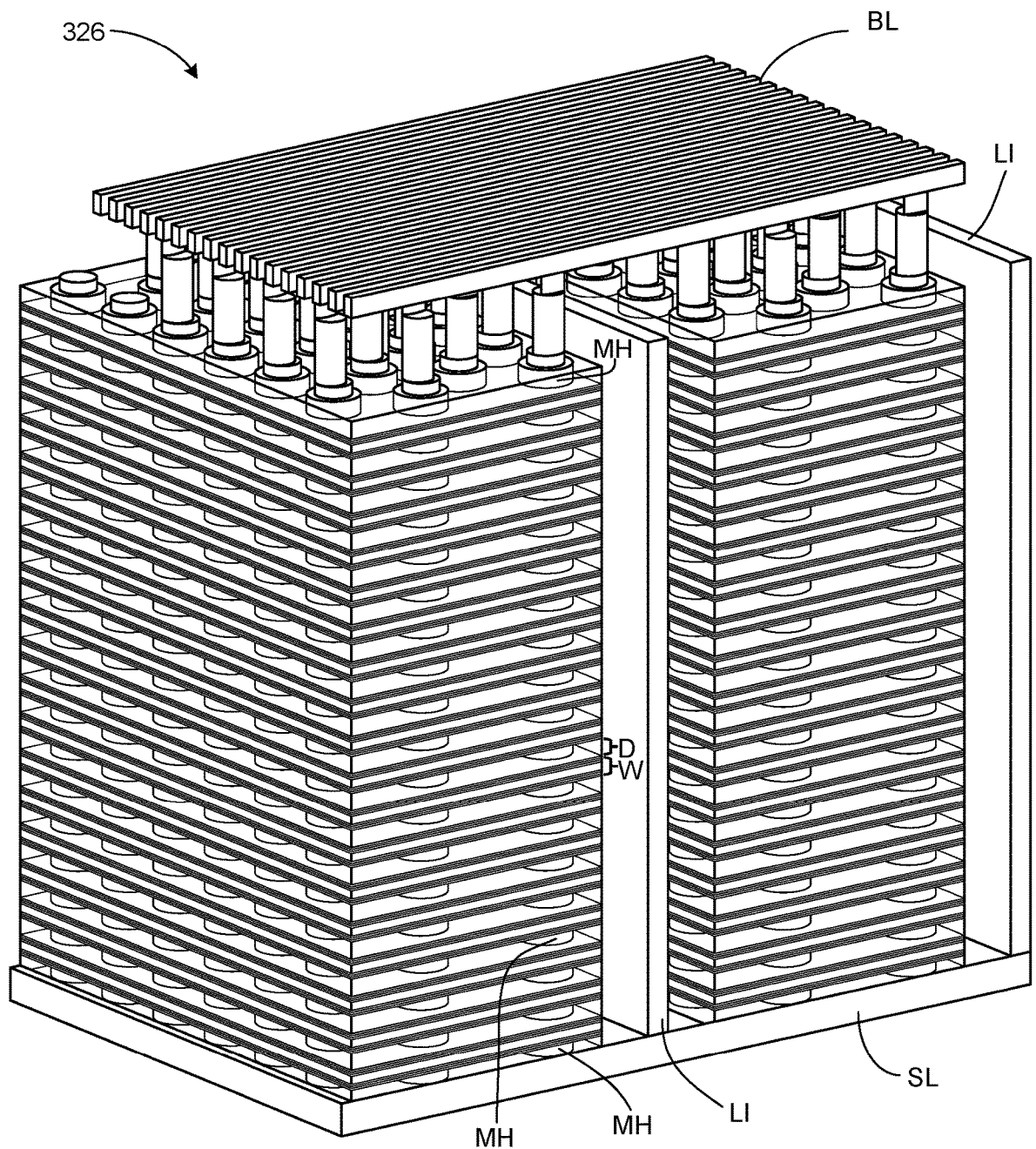
FIG. 5 is a perspective view of a portion of one example embodiment of a monolithic three dimensional memory array that can comprise memory structure.

FIG. 5 is a perspective view of a portion of one example embodiment of a monolithic three dimensional memory array that can comprise memory structure 326, which includes a plurality non-volatile memory cells. For example, FIG. 5 shows a portion of one block comprising memory. The structure depicted includes a set of bit lines BL positioned above a stack of alternating dielectric layers and conductive layers with vertical columns of materials extending through the dielectric layers and conductive layers. For example purposes, one of the dielectric layers is marked as D and one of the conductive layers (also called word line layers) is marked as W. The word line layers contain one or more word lines that are connected to memory cells. For example, a word line may be connected to a control gate of a memory cell. The number of alternating dielectric layers and conductive layers can vary based on specific implementation requirements. One set of embodiments includes between 108-304 alternating dielectric layers and conductive layers. One example embodiment includes 96 data word line layers, 8 select layers, 6 dummy word line layers and 110 dielectric layers. More or fewer than 108-304 layers can also be used. The alternating dielectric layers and conductive layers are divided into four "fingers" or sub-blocks by local interconnects LI, in an embodiment. FIG. 5 shows two fingers and two local interconnects LI. Below the alternating dielectric layers and word line layers is a source line layer SL. Vertical columns of materials (also known as memory holes) are formed in the stack of alternating dielectric layers and conductive layers. For example, one of the vertical columns/memory holes is marked as MH. Note that in FIG. 5, the dielectric layers are depicted as see-through so that the reader can see the memory holes positioned in the stack of alternating dielectric layers and conductive layers. In one embodiment, NAND strings are formed by filling the vertical column/memory hole with materials including a charge-trapping material to create a vertical column of memory cells. Each memory cell can store one or more bits of data. More details of the three dimensional monolithic memory structure 326 is provided below with respect to FIGS. 6A-6D.

Figure 6A:
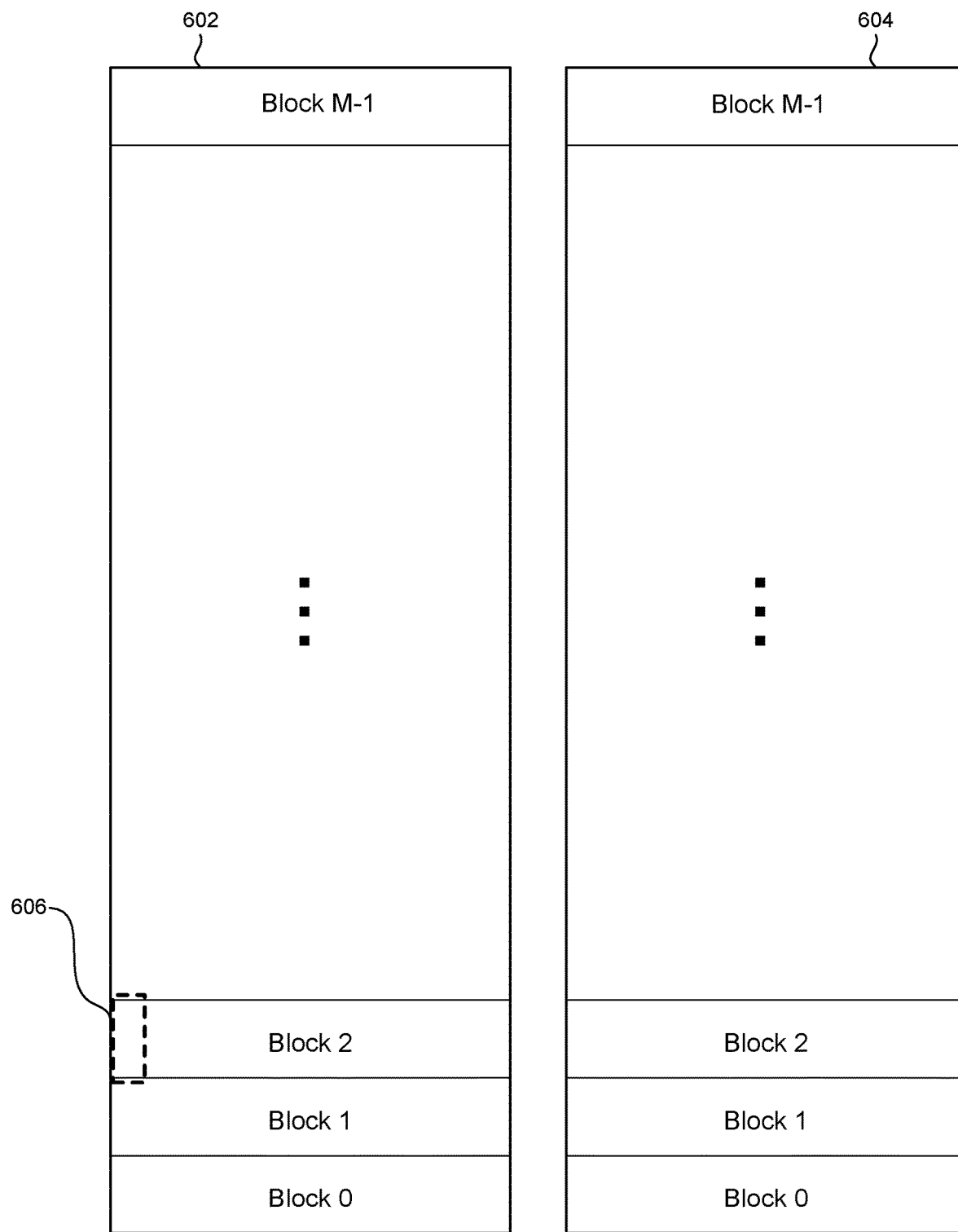
FIG. 6A is a block diagram explaining one example organization of memory structure.

FIG. 6A is a block diagram explaining one example organization of memory structure 326, which is divided into two planes 602 and 604. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 602 includes block 0, 2, 4, 6, . . . and plane 604 includes blocks 1, 3, 5, 7, . . . . In on embodiment, a block of memory cells is a unit of erase. That is, all memory cells of a block are erased together. In other embodiments, memory cells can be grouped into blocks for other reasons, such as to organize the memory structure 326 to enable the signaling and selection circuits.

Figure 6B:
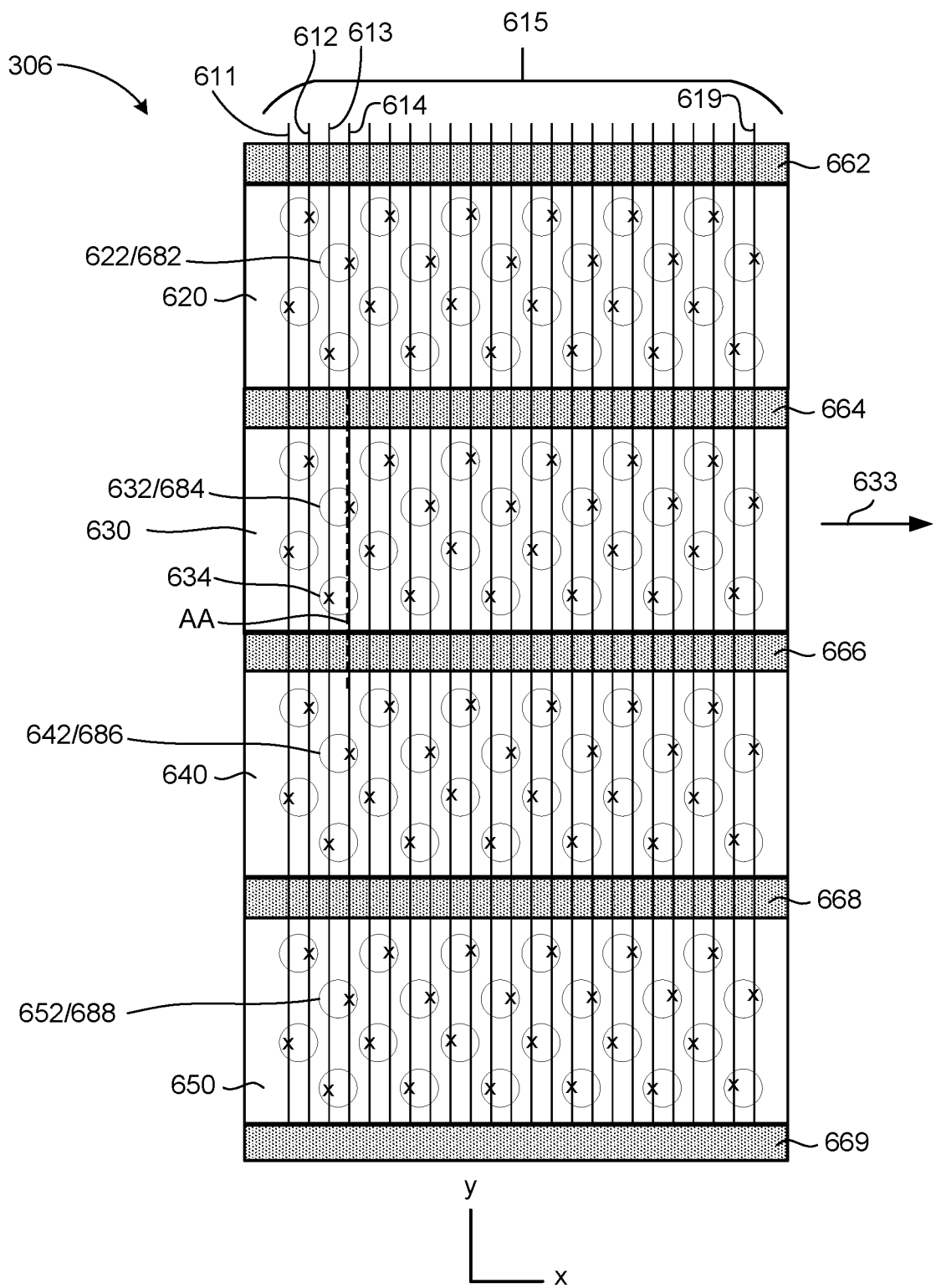
FIG. 6B is a block diagram depicting a top view of a portion of one block from memory structure.
Figure 6C:
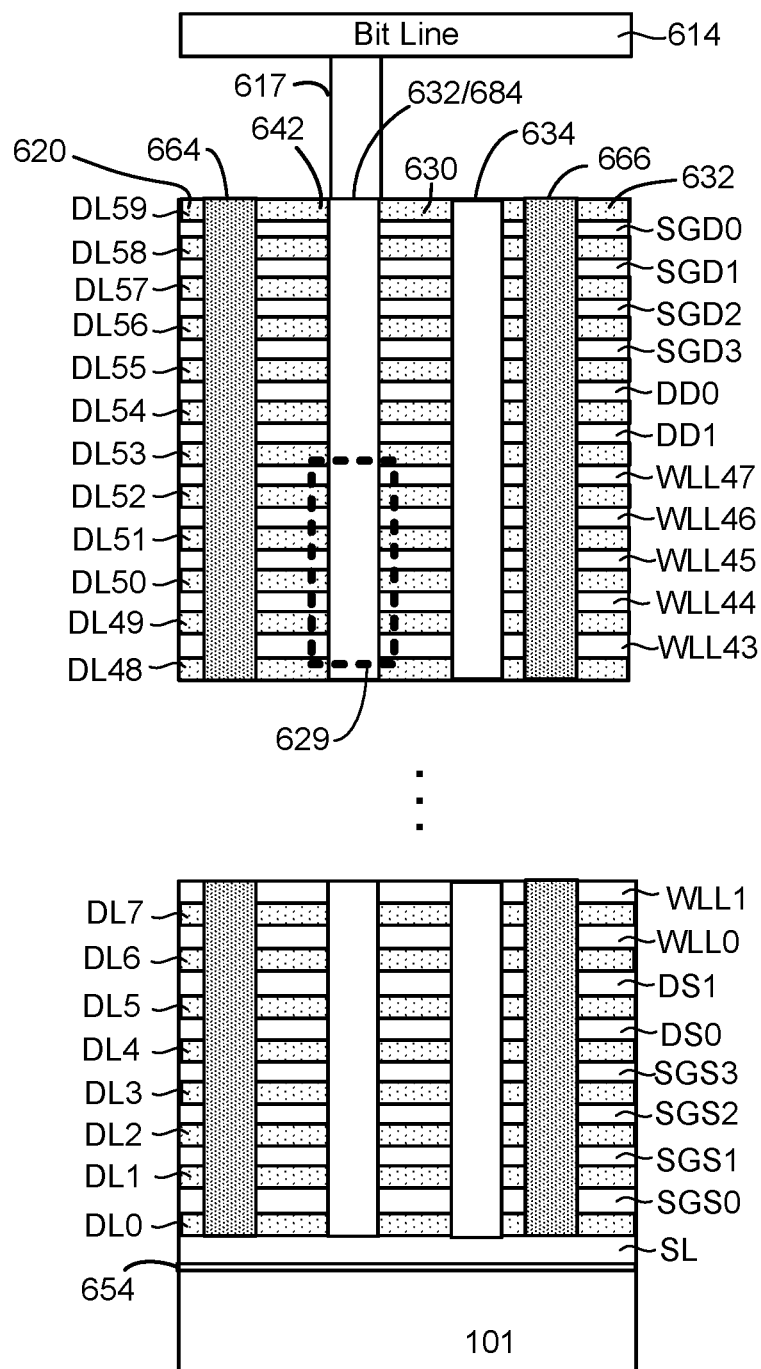
FIG. 6C depicts a portion of an embodiment of three dimensional memory structure showing a cross-sectional view along line AA of FIG. 6B.

FIGS. 6B-6D depict an example 3D NAND structure. FIG. 6B is a block diagram depicting a top view of a portion of one block from memory structure 326. The portion of the block depicted in FIG. 6B corresponds to portion 606 in block 2 of FIG. 6A. As can be seen from FIG. 6B, the block depicted in FIG. 6B extends in the direction of 633. In one embodiment, the memory array will have 60 layers. Other embodiments have less than or more than 60 layers. However, FIG. 6B only shows the top layer.

FIG. 6B depicts a plurality of circles that represent the vertical columns. Each of the vertical columns include multiple select transistors and multiple memory cells. In one embodiment, each vertical column implements a NAND string. For example, FIG. 6B depicts vertical columns 622, 632, 642 and 652. Vertical column 622 implements NAND string 682. Vertical column 632 implements NAND string 684. Vertical column 642 implements NAND string 686. Vertical column 652 implements NAND string 688. More details of the vertical columns are provided below. Since the block depicted in FIG. 6B extends in the direction of arrow 633 and in the direction of arrow 633, the block includes more vertical columns than depicted in FIG. 6B.

FIG. 6B also depicts a set of bit lines 615, including bit lines 611, 612, 613, 614, . . . 619. FIG. 6B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 614 is connected to vertical columns 622, 632, 642 and 652.

The block depicted in FIG. 6B includes a set of local interconnects 662, 664, 666, 668 and 669 that connect the various layers to a source line below the vertical columns. Local interconnects 662, 664, 666, 668 and 669 also serve to divide each layer of the block into four regions; for example, the top layer depicted in FIG. 6B is divided into regions 620, 630, 640 and 650, which are referred to as fingers or sub-blocks. In the layers of the block that implement memory cells, the four regions are referred to as word line sub-blocks that are separated by the local interconnects. In one embodiment, the word line sub-blocks on a common level of a block connect together at the end of the block to form a single word line. In another embodiment, the word line sub-blocks on the same level are not connected together. In one example implementation, a bit line only connects to one vertical column in each of regions 620, 630, 640 and 650. In that implementation, each block has sixteen rows of active columns and each bit line connects to four rows in each block. In one embodiment, all of four rows connected to a common bit line are connected to the same word line (via different word line sub-blocks on the same level that are connected together); therefore, the system uses the source side select lines and the drain side select lines to choose one (or another subset) of the four to be subjected to a memory operation (program, verify, read, and/or erase).

Although FIG. 6B shows each region having four rows of vertical columns, four regions and sixteen rows of vertical columns in a block, those exact numbers are an example implementation. Other embodiments may include more or fewer regions per block, more or fewer rows of vertical columns per region and more or fewer rows of vertical columns per block.

FIG. 6B also shows the vertical columns being staggered. In other embodiments, different patterns of staggering can be used. In some embodiments, the vertical columns are not staggered.

FIG. 6C depicts a portion of an embodiment of three dimensional memory structure 326 showing a cross-sectional view along line AA of FIG. 6B. This cross sectional view cuts through vertical columns 632 and 634 and region 630 (see FIG. 6B). The structure of FIG. 6C includes four drain side select layers SGD0, SGD1, SGD2 and SGD3; four source side select layers SGS0, SGS1, SGS2 and SGS3; four dummy word line layers DD0, DD1, DS0 and DS1; and forty eight data word line layers WLL0-WLL47 for connecting to data memory cells. Other embodiments can implement more or less than four drain side select layers, more or less than four source side select layers, more or fewer than four dummy word line layers, and more or fewer than forty eight word line layers (e.g., 96 word line layers). Vertical columns 632 and 634 are depicted protruding through the drain side select layers, source side select layers, dummy word line layers and word line layers. In one embodiment, each vertical column comprises a NAND string. For example, vertical column 632 comprises NAND string 684. Below the vertical columns and the layers listed below is substrate 101, an insulating film 654 on the substrate, and source line SL. The NAND string of vertical column 632 has a source end at a bottom of the stack and a drain end at a top of the stack. As in agreement with FIG. 6B, FIG. 6C show vertical column 632 connected to Bit Line 614 via connector 617. Local interconnects 664 and 666 are also depicted.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DD0, DD1, DS0 and DS1 connect to dummy memory cells. A dummy memory cell does not store user data, while a data memory cell is eligible to store user data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

In some embodiments, the word lines are read sequentially, which means that the word lines are read either from low to high (e.g., WLL0 to WLL47) or from high to low (e.g., WLL47 to WLL0). It is not required to read the entire set of word lines when reading sequentially. Techniques are disclosed herein for providing compensation for interference caused by adjacent memory cells on target memory cells during a sequential read.

In some embodiments, the read of an individual word line is broken down into separate reads of sub-blocks. Referring again to FIG. 6B, the block is divided into four sub-blocks 620, 630, 640, 650. Thus, the four sub-blocks on one word line layer may be read, prior to reading the four sub-blocks on an adjacent word line layer. In some embodiments, data state information is used to provide compensation on a sub-block basis. For example, data state information for memory cells at WLL35 is kept for each of the four sub-blocks 620-650. Then, when reading sub-block 620 at WLL36 the data state information for sub-block 620 at WLL35 is used to compensate for interference from adjacent memory cells in sub-block 620 at WLL35, when reading sub-block 630 at WLL36 the data state information for sub-block 630 at WLL35 is used to compensate for interference from adjacent memory cells in sub-block 620 at WLL35, etc.

FIG. 6D depicts a cross sectional view of region 629 of FIG. 6C that includes a portion of vertical column 632. In one embodiment, the vertical columns are round and include four layers; however, in other embodiments more or less than four layers can be included and other shapes can be used. In one embodiment, vertical column 632 includes an inner core layer 670 that is made of a dielectric, such as $SiO_2$. Other materials can also be used. Surrounding inner core 670 is polysilicon channel 671. Materials other than polysilicon can also be used. Note that it is the channel 671 that connects to the bit line. Surrounding channel 671 is a tunneling dielectric 672. In one embodiment, tunneling dielectric 672 has an ONO structure. Surrounding tunneling dielectric 672 is charge trapping layer 673, such as (for example) Silicon Nitride. Other memory materials and structures can also be used. The technology described herein is not limited to any particular material or structure.

FIG. 6D depicts dielectric layers DLL49, DLL50, DLL51, DLL52 and DLL53, as well as word line layers WLL43, WLL44, WLL45, WLL46, and WLL47. Each of the word line layers includes a word line region 676 surrounded by an aluminum oxide layer 677, which is surrounded by a blocking oxide ($SiO_2$) layer 678. The physical interaction of the word line layers with the vertical column forms the memory cells. Thus, a memory cell, in one embodiment, comprises channel 671, tunneling dielectric 672, charge trapping layer 673, blocking oxide layer 678, aluminum oxide layer 677 and word line region 676. For example, word line layer WLL47 and a portion of vertical column 632 comprise a memory cell MC1. Word line layer WLL46 and a portion of vertical column 632 comprise a memory cell MC2. Word line layer WLL45 and a portion of vertical column 632 comprise a memory cell MC3. Word line layer WLL44 and a portion of vertical column 632 comprise a memory cell MC4. Word line layer WLL43 and a portion of vertical column 632 comprise a memory cell MC5. In other architectures, a memory cell may have a different structure; however, the memory cell would still be the storage unit.

Note that the charge trapping layer 673 may extend from one end of the NAND string to the other, and hence may be referred to herein as a continuous charge trapping layer. When a memory cell is programmed, electrons are stored in a portion of the charge trapping layer 673 which is associated with the memory cell. These electrons are drawn into the charge trapping layer 673 from the channel 671, through the tunneling dielectric 672, in response to an appropriate voltage on word line region 676. The Vt of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 7:
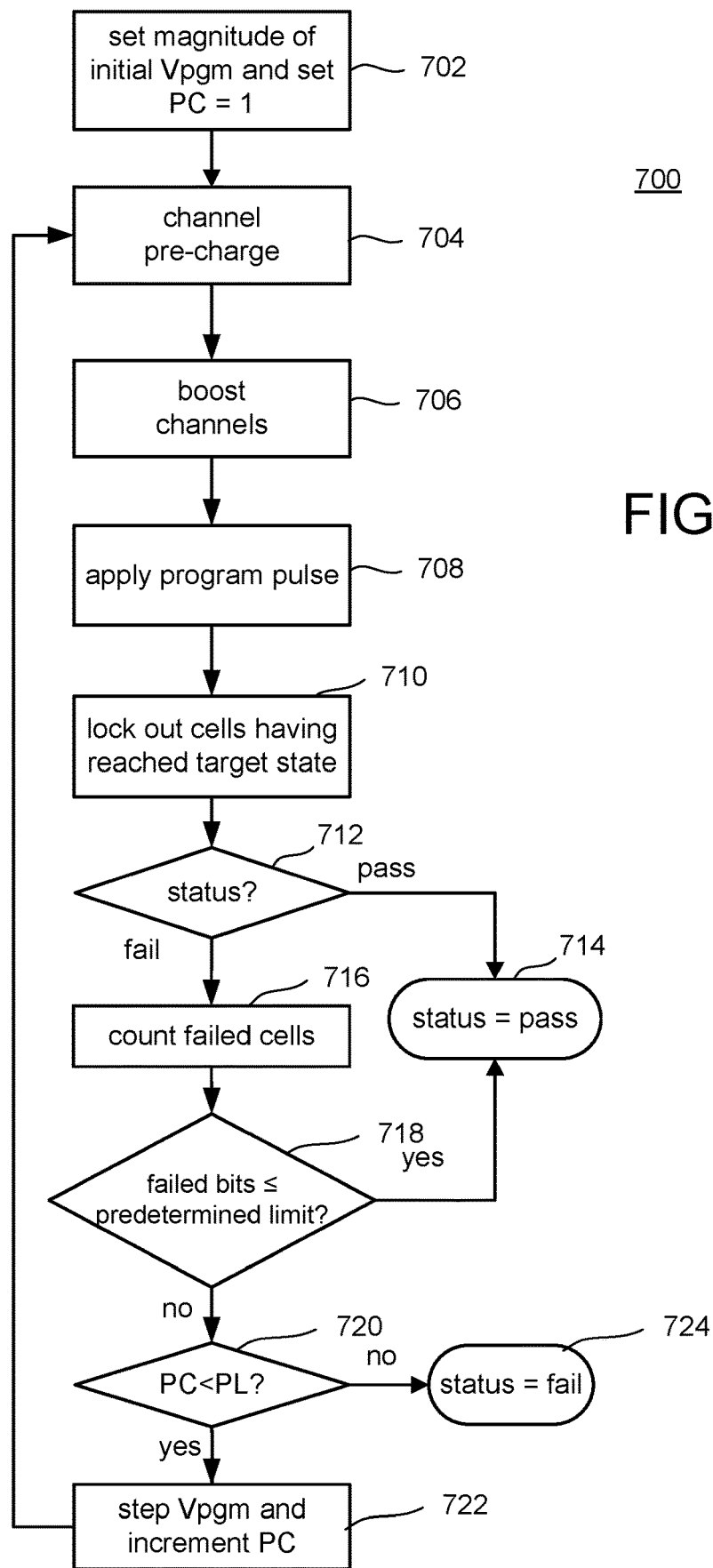
FIG. 7 is a flowchart describing one embodiment of a process for programming NAND strings of memory cells organized into an array.

FIG. 7 is a flowchart describing one embodiment of a process 700 for programming NAND strings of memory cells. The process of FIG. 7 can be performed at the direction of state machine 312. In one example embodiment, the process of FIG. 7 is performed on memory die 300 using the control circuitry 310 (and read/write circuits 328, as well as decoders 332/324) discussed above. In one example embodiment, the process of FIG. 7 is performed by integrated memory assembly 306 using the control circuitry 310 discussed above. The process includes multiple loops, each of which includes a program phase (e.g., steps 704-708) and a verify phase (e.g., steps 710-718).

In many implementations, the magnitude of the program pulses is increased with each successive pulse by a predetermined step size. In step 702 of FIG. 7, the programming voltage (Vpgm) is initialized to the starting magnitude (e.g., ~12-16V or another suitable level) and a program counter PC maintained by state machine 312 is initialized at 1.

In one embodiment, the set of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 704 the memory system will pre-charge channels of NAND strings that include memory cells connected to the selected word line that are to be inhibited from programming.

In one embodiment, step 704 is the start of a program operation. In some embodiments, different sets of memory cells are programmed concurrently. For example, programming of memory cells in different memory structures 326 may be performed concurrently. In some embodiments, the start of concurrent program operations (e.g., step 704) is staggered such that step 704 occurs at different times for the different memory structures 326.

In step 706, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 708, a program pulse of the program signal Vpgm is applied to the selected word line (the word line selected for programming). If a memory cell on a NAND string should be programmed, then the corresponding bit line is biased at a program enable voltage, in one embodiment. Herein, such a NAND string is referred to as a "selected NAND string."

In step 708, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their Vt change, unless they are inhibited from programming.

In step 710, memory cells that have reached their target states are locked out from further programming. Step 710 may include performing verifying at one or more verify reference levels. In one embodiment, the verification process is performed by testing whether the threshold voltages of the memory cells selected for programming have reached the appropriate verify reference voltage.

In step 710, a memory cell may be locked out after the memory cell has been verified (by a test of the Vt) that the memory cell has reached its target state.

If, in step 712, it is determined that all of the memory cells have reached their target threshold voltages (pass), the programming process is complete and successful because all selected memory cells were programmed and verified to their target states. A status of "PASS" is reported in step 714. Otherwise if, in step 712, it is determined that not all of the memory cells have reached their target threshold voltages (fail), then the programming process continues to step 716.

In step 716, the memory system counts the number of memory cells that have not yet reached their respective target Vt distribution. That is, the system counts the number of memory cells that have, so far, failed to reach their target state. This counting can be done by the state machine 312, the memory controller 102, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 718, it is determined whether the count from step 716 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 714. In this situation, enough memory cells programmed correctly such that the few remaining memory cells that have not been completely programmed can be corrected using ECC during the read process. In some embodiments, the predetermined limit used in step 718 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 720 and the program counter PC is checked against the program limit value (PL). Examples of program limit values include 1, 12, 16, 19 and 30; however, other values can be used. If the program counter PC is not less than the program limit value PL, then the program process is considered to have failed and a status of FAIL is reported in step 724. If the program counter PC is less than the program limit value PL, then the process continues at step 722 during which time the Program Counter PC is incremented by 1 and the program voltage Vpgm is stepped up to the next magnitude. For example, the next pulse will have a magnitude greater than the previous pulse by a step size (e.g., a step size of 0.1-1.0 volts). After step 722, the process loops back to step 704 and another program pulse is applied to the selected word line so that another iteration (steps 704-722) of the programming process of FIG. 7 is performed.

At the end of a successful programming process, the threshold voltages of the memory cells should be within one or more distributions of threshold voltages for programmed memory cells or within a distribution of threshold voltages for erased memory cells, as appropriate. FIG. 8A illustrates example Vt distributions for the memory array when each memory cell stores three bits of data. Other embodiments, however, may use other data capacities per memory cell (e.g., such as one, two, four, or five bits of data per memory cell). FIG. 8A shows eight Vt distributions, corresponding to eight data states. The first Vt distribution S0 represents memory cells that are erased. State S0 may be referred to herein as an erase state (Er State). The other seven Vt distributions S1-S7 represent memory cells that are programmed and, therefore, may be called programmed states. Each Vt distribution (data state) corresponds to predetermined values for the set of data bits. The specific relationship between the data programmed into the memory cell and the Vt levels of the cell depends upon the data encoding scheme adopted for the cells. In one embodiment, data values are assigned to the Vt ranges using a Gray code assignment so that if the Vt of a memory erroneously shifts to its neighboring physical state, only one bit will be affected.

FIG. 8A shows eight Vt distributions 802-816. Distribution 802 corresponds to state S0; distribution 804 corresponds to state 51; distribution 806 corresponds to state S2; distribution 808 corresponds to state S3; distribution 810 corresponds to state S4; distribution 812 corresponds to state S5; distribution 814 corresponds to state S6; and distribution 816 corresponds to state S7. FIG. 8A also shows seven read reference voltages, Vr1, Vr2, Vr3, Vr4, Vr5, Vr6, and Vr7 for reading data from memory cells. By testing (e.g., performing sense operations) whether the Vt of a given memory cell is above or below the seven read reference voltages, the system can determine what data state (i.e., S0, S1, S2, S3, . . . ) a memory cell is in. In some embodiment, lateral DR interference is mitigated by the magnitude of the read reference voltages.

FIG. 8A also shows seven verify reference voltages, Vv1, Vv2, Vv3, Vv4, Vv5, Vv6, and Vv7. In some embodiments, when programming memory cells to data state S1, the system will test whether those memory cells have a Vt greater than or equal to Vv1. When programming memory cells to data state S2, the system will test whether the memory cells have threshold voltages greater than or equal to Vv2. When programming memory cells to data state S3, the system will determine whether memory cells have their Vt greater than or equal to Vv3. When programming memory cells to data state S4, the system will test whether those memory cells have a Vt greater than or equal to Vv4. When programming memory cells to data state S5, the system will test whether those memory cells have a Vt greater than or equal to Vv5. When programming memory cells to data state S6, the system will test whether those memory cells have a Vt greater than or equal to Vv6. When programming memory cells to data state S7, the system will test whether those memory cells have a Vt greater than or equal to Vv7. The programmed state (e.g., S1) that is verified by the lowest magnitude reference voltage (e.g., Vv1) is referred to herein as the "lowest programmed state." The programmed state (e.g., S7) that is verified by the highest magnitude reference voltage (e.g., Vv7) is referred to herein as the "highest programmed state."

FIG. 8A also shows Vev (for an "erase verify voltage"), which is a voltage level to test whether a memory cell has been properly erased. As depicted in FIG. 8, a memory cell that is erased should have a Vt below Vev. In general, during verify operations and read operations, the selected word line is connected to a voltage, a level of which is specified for each read operation (e.g., see read compare levels Vr1, Vr2, Vr3, Vr4, Vr5, Vr6, and Vr7, of FIG. 8A) or verify operation (e.g. see verify target levels Vv1, Vv2, Vv3, Vv4, Vv5, Vv6, and Vv7 of FIG. 8A) in order to determine whether a Vt of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the Vt of the memory cell. If the conduction current is not measured to be greater than the certain value, then it is assumed that the memory cell did not turn on and the voltage applied to the word line is not greater than the Vt of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

In one embodiment, known as full sequence programming, memory cells can be programmed from the erased state S0 directly to any of the programmed data states S1-S7. For example, a population of memory cells to be programmed may first be erased so that all memory cells in the population are in erased state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. In some embodiments, data states S1-S7 can overlap, with controller 102 relying on error correction to identify the correct data being stored.

Figure 8B:
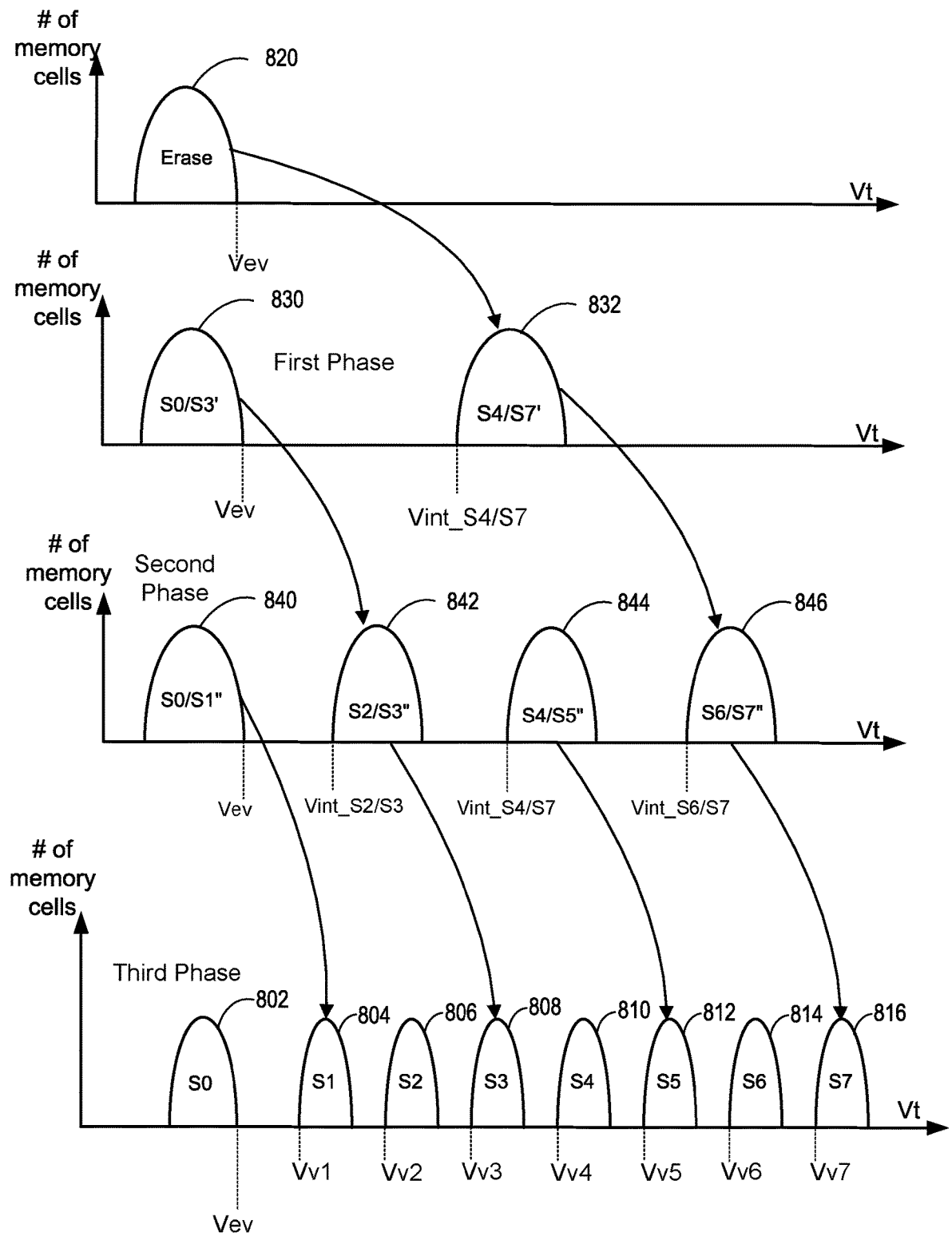
FIG. 8B depicts one embodiment of multiple phase programming for the three bit per cell example of FIG. 8A.

The technology described herein can also be used with other types of programming in addition to full sequence programming (including, but not limited to, multiple stage/phase programming). FIG. 8B depicts one embodiment of multiple phase programming for the three bit per cell example of FIG. 8A. Initially, all memory cells are erased to the erase Vt distribution 820. In the first phase, all memory cells to end up in any of data states S4-S7 are programmed to an S4/S7 intermediate state having S4/S7' Vt distribution 832. The upper tail of the S4/S7' Vt distribution 832 should be no higher than the upper tail of the eventual S4 Vt distribution 810. The reference voltage Vint_S4/S7 is used for verification during the first phase. Memory cells to end up in any of data states S0-S3 do not receive programming in the first phase, as indicated by relabeling the erase Vt distribution 820 as S0/S3' Vt distribution 830.

In a second phase, memory cells to end up in either data state S2 or S3 are programmed from S0/S3' Vt distribution 830 to S2/S3" Vt distribution 842. Memory cells to end in either S0 or S1 are not required to receive programming in the second phase, as indicated by relabeling the S0/S3' Vt distribution 830 as S0/S1" Vt distribution 840. Also in the second phase, memory cells to end up in either data state S6 or S6 are programmed from S4/S7' Vt distribution 832 to S6/S7" Vt distribution 846. Memory cells to end in either S4 or S5 are not required to receive programming in the second phase, as indicated by relabeling the S4/S6' Vt distribution 832 as S4/S5" Vt distribution 844.

In a third phase, memory cells are programmed from S0/S1" Vt distribution 840 to S1 Vt distribution 804. Memory cells to end in S0 do not receive programming in the third phase, as indicated by relabeling the S0/S1" Vt distribution 840 as S0 Vt distribution 802. In the third phase, memory cells are programmed from S2/S3" Vt distribution 842 to S3 Vt distribution 808. Memory cells to end in S2 are not required to receive programming in the third phase, as indicated by relabeling the S2/S3" Vt distribution 842 as S2 Vt distribution 806. In the third phase, memory cells are programmed from S4/S5" Vt distribution 844 to S5 Vt distribution 812. Memory cells to end in S4 are not required to receive programming in the third phase, as indicated by relabeling the S4/S5" Vt distribution 844 as S4 Vt distribution 810. In the third phase, memory cells are programmed from S6/S7" Vt distribution 846 to S7 Vt distribution 816. Memory cells to end in S6 do not receive programming in the third phase, as indicated by relabeling the S6/S7" Vt distribution 846 as S6 Vt distribution 814.

In one embodiment, a first page is programmed in the first phase, a second page is programmed in the second phase, and a third page is programmed in the third phase. Herein, once on page has been programmed into a group of memory cells, the memory cells can be read back to retrieve the page. Hence, the intermediate states associated with multi-phase programming are considered herein to be programmed states.

Figure 9:
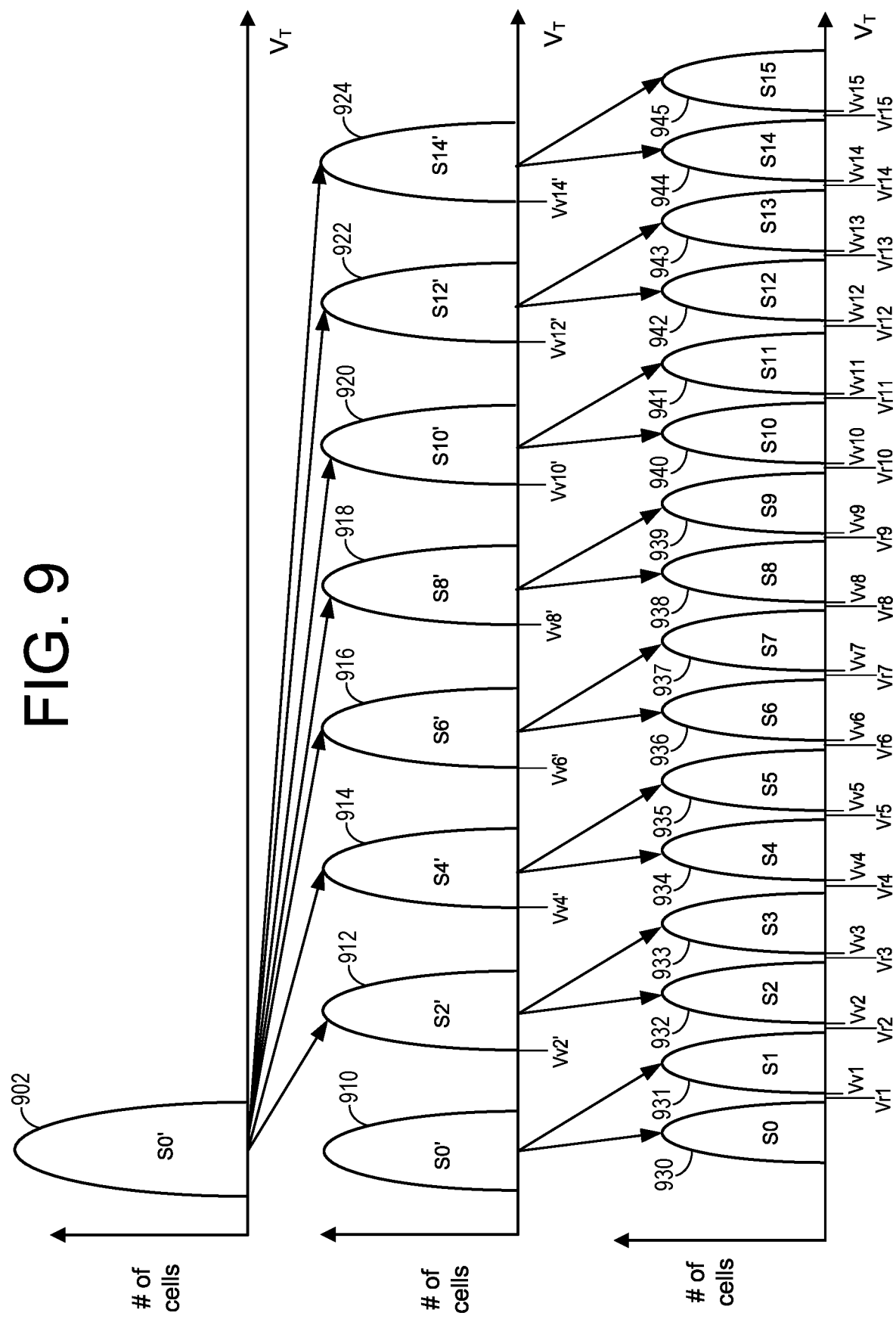
FIG. 9 depicts threshold Vt distributions for one embodiment of foggy-fine programming.

As noted above, some embodiments include multi-phase phase programming. One type of multi-phase phase programming includes a foggy phase and a fine phase, which is referred to herein a foggy-fine programming. FIG. 9 depicts threshold Vt distributions for one embodiment of foggy-fine programming. Distribution 902 represents the erase state after the erase operation, but before the start of foggy-fine programming.

Foggy distributions 910-924 are the Vt distributions after the foggy phase. Foggy verify levels Vv2', Vv4', Vv6', Vv8', Vv10', Vv12', and Vv14' are depicted adjacent to the respective distributions 910-924. Arrows in FIG. 9 show that memory cells may be programmed from the erase state distribution 902 to one of the foggy distributions S2'-S14'. In the foggy phase, memory cells to have a final data state of either S2 or S3 are programmed to a foggy S2' state, as shown by distribution 912. Memory cells to have a final data state of either S4 or S5 are programmed to a foggy S4' state, as shown by distribution 914. Memory cells to have a final data state of either S6 or S7 are programmed to a foggy S6' state, as shown by distribution 916. Memory cells to have a final data state of either S8 or S9 are programmed to a foggy S8' state, as shown by distribution 918. Memory cells to have a final data state of either S10 or S11 are programmed to a foggy S10' state, as shown by distribution 920. Memory cells to have a final data state of either S12 or S13 are programmed to a foggy S12' state, as shown by distribution 922. Memory cells to have a final data state of either S14 or S15 are programmed to a foggy S14' state, as shown by distribution 924. Memory cells to either stay at S0 or have a final state of S1 do not receive any programming in the foggy phase, as shown by distribution 910.

Fine Vt distributions 930-945 are the Vt distributions after the fine phase. The fine Vt distributions may also be referred to as final data states. In contrast, the foggy Vt distributions could be referred to as intermediate data states. Fine verify levels Vv1, Vv2, Vv3, Vv4, Vv5, Vv6, Vv7, Vv8, Vv9, Vv10, Vv11, Vv12, Vv13, Vv14, and Vv15 are depicted adjacent to the respective fine distributions 930-945. Read reference levels Vv1, Vr2, Vr3, Vr4, Vr5, Vr6, Vr7, Vr8, Vr9, Vr10, Vr11, Vr12, Vr13, Vr14, and Vr15 are depicted between the fine distributions 930-945. Arrows in FIG. 9 show that memory cells may be programmed from one of the foggy Vt distributions to one of the fine Vt distributions. For example, memory cells in foggy Vt distribution S2' 912 are programmed to either fine Vt distribution S2 932 or fine Vt distribution S3 933. Similar programming may be used for memory cells to be programmed to other final states.

Figure 10:
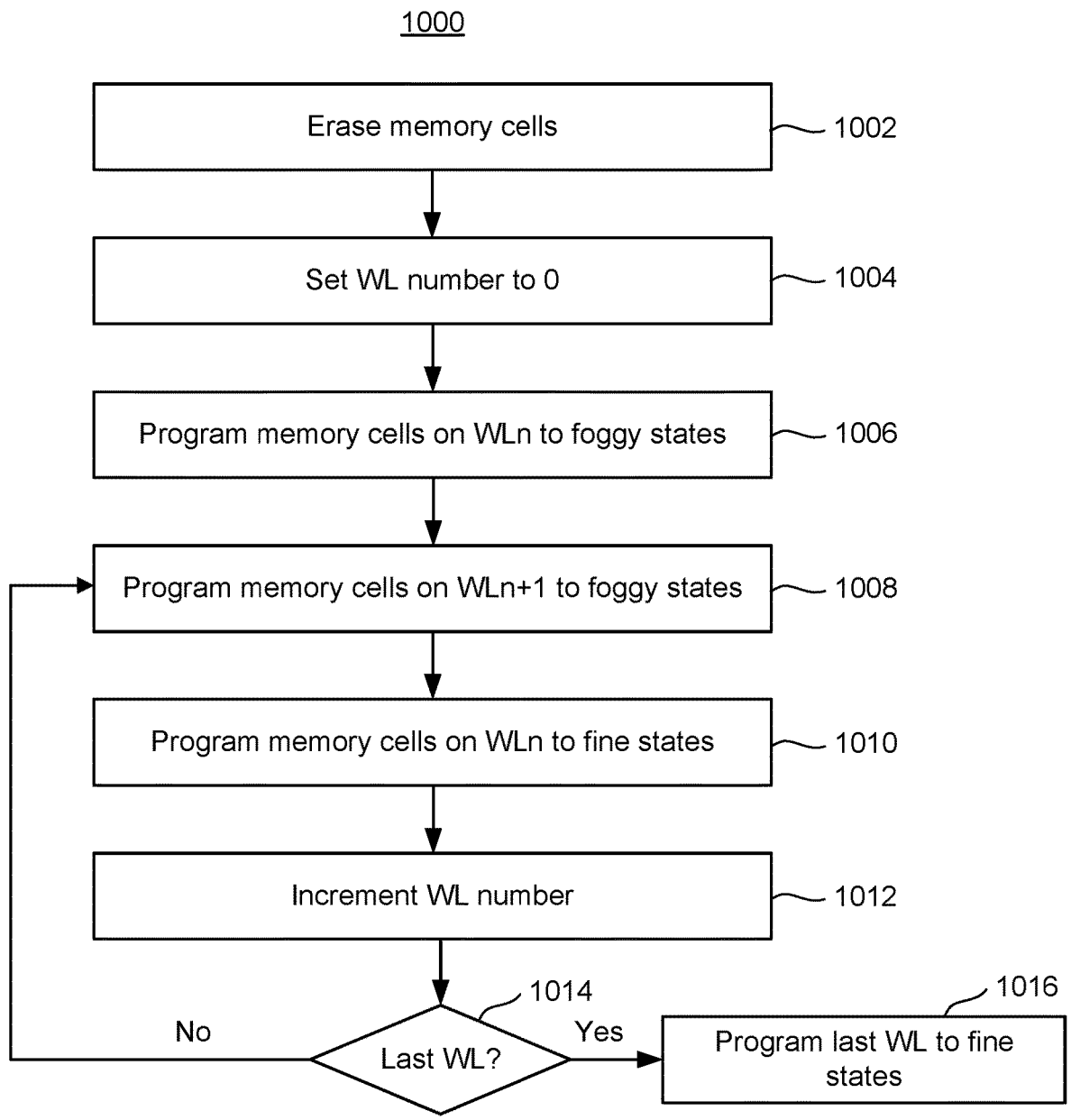
FIG. 10 is a flowchart that provides further details for programming a block of memory cells using a foggy-fine programming procedure.

FIG. 10 is a flowchart that provides further details for programming a block of memory cells using a foggy-fine programming procedure. The process may be used to program a block containing NAND strings. Step 1002 includes erasing the block of memory cells. After step 1002, the Vt distribution for each WL may resemble Vt distribution 902.

Step 1004 includes setting the WL number (WLn) to 0. Step 1006 includes programming memory cells on WLn to foggy states. After the first iteration of step 1006, the Vt distributions for WL0 may resemble Vt distributions 910-924 in FIG. 9.

Step 1008 includes programming memory cells on WLn+1 to foggy states. After the first iteration of step 1008, the Vt distributions for WL1 may resemble Vt distributions 910-924 in FIG. 9.

Step 1010 includes programming memory cells on WLn to fine states. After the first iteration of step 1010, the Vt distributions for WL0 may resemble Vt distributions 930-945 in FIG. 9. Step 1012 includes incrementing the WL number. Step 1014 is a determination of whether this is the last WL to be programmed. If not, control passes to step 1008.

During the second iteration, step 1008 includes programming memory cells on WL2 to foggy states. During the second iteration, step 1010 includes programming memory cells on WL1 to fine states. Thus, note that during the first iteration of step 1010 memory cells on WL0 were programmed to the fine states (which was after the memory cells on WL1 were programmed to the foggy states in the first iteration of step 1008). However, programming the memory cells on WL1 to the fine states in the second iteration of step 1010, causes interference to the memory cells on WL0. That is, programming the memory cells on WL1 to the fine states in the second iteration of step 1010 adds charge to the charge trapping layer 673 of memory cells on WL1. This additional charge may change the apparent Vt of memory cells on WL0. Herein, this is referred to as NWI.

During the second iteration, step 1012 includes incrementing the WL number to 2. The process continues to program more word lines until it is determined in step 1014 that this is the last WL. In step 1016, the last WL in the block is programmed to the fine states.

Note that process 1000 describes a sequential order in which word lines are programmed from low number to high number (or from source end to drain end of the NAND strings, which may also be referred to a programming from the source line to the bit line). In another embodiment, the word lines are programmed sequentially from high WL number to low WL number (or from drain end to source end of the NAND strings). When programming from high WL number to low WL number, the NWI for memory cells on WLn occurs when programming WLn−1. In other words, WLn−1 is programmed after WLn.

The effects of NWI are most pronounced in situations where a memory cell adjacent a target memory cell is programmed subsequent to the target memory cell, although its effects may be seen in other situations as well. A charge placed on the charge storage region of an adjacent memory cell, or a portion of the charge, will effectively be coupled to the target memory cell through electrical field coupling, resulting in an apparent shift of the Vt of the target memory cell. A memory cell's apparent Vt can be shifted to such a degree after being programmed that it will not turn on and off (conduct) under the applied read reference voltages as expected for a memory cell in the memory state to which it was intended to be programmed.

Figure 11:
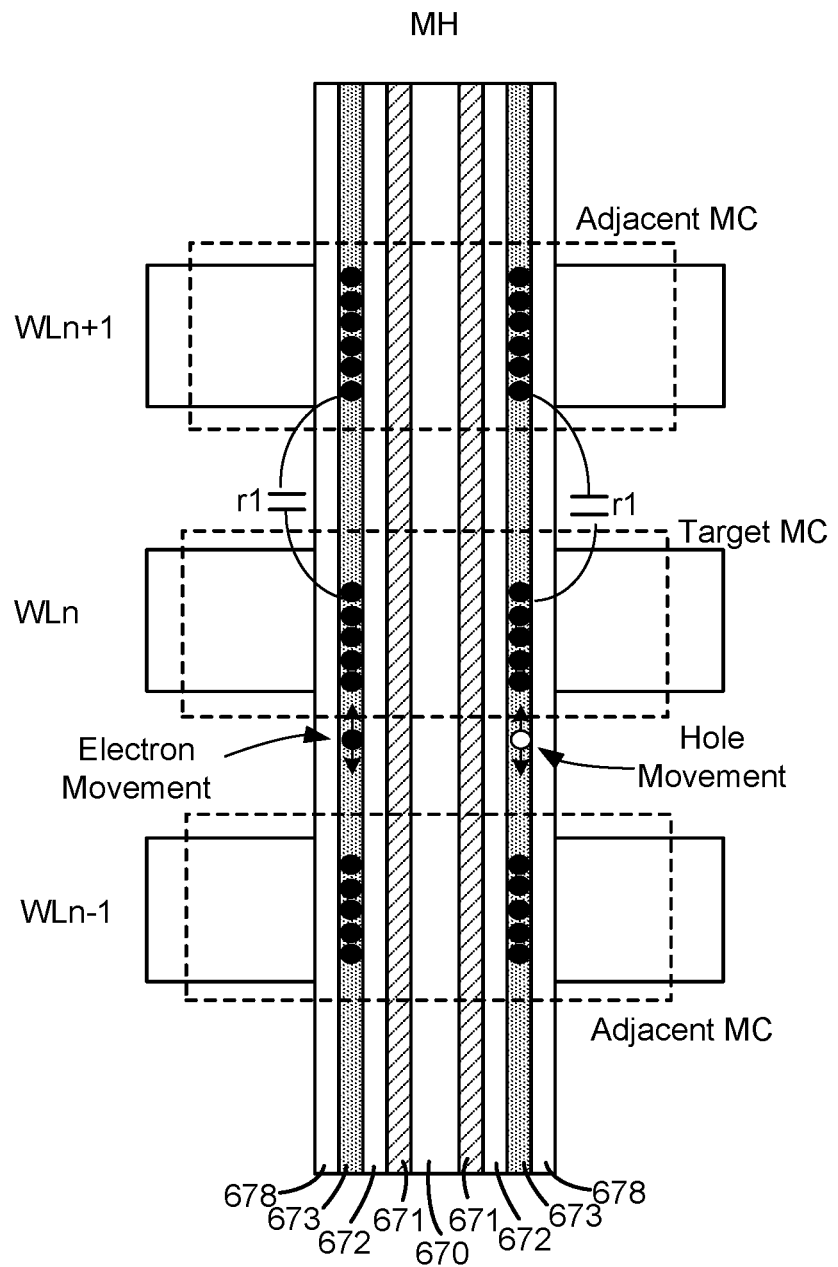
FIG. 11 graphically explains the concept of both NWI and lateral DR.

FIG. 11 graphically depicts a possible explanation of both NWI and lateral DR. FIG. 11 depicts a simplified view of FIG. 6D with target word line WLn and two adjacent word lines WLn−1, WLn+1. For purpose of discussion, it will be assumed that the programming order is WLn−1, WLn, WLn+1. FIG. 11 depict a memory hole MH including inner core layer 670, channel layer 671, tunneling dielectric layer 672, charge trapping layer 673, and blocking layer 678.

First a possible explanation of NWI will be discussed. As a result of programming the adjacent memory cell connected to WLn+1, an electric field may be introduced by the electric charge that is added to the memory cell on WLn+1. Note that there may already be some electric charge on the memory cell on WLn+1, in which case there is a change in the electric charge due to the new charge added to the memory cell on WLn+1. This electric field has an impact on the Vt of the target cell on WLn. The impact may be described by a capacitive coupling, as depicted by coupling component r1.

Significantly, the magnitude of the coupling component r1 will depend on factors such as the distance between WLn and WLn+1. Note that this distance can vary between blocks, or even between NAND strings in the same block. In some embodiments, compensation for NWI is achieved by applying a suitable read pass voltage to WLn+1 when reading target cells on WLn, which automatically compensates for such coupling differences. By applying compensation to WLn+1, the impact of the compensation may depend on the distance between WLn and WLn+1.

Also, since NWI may arise due to programming WLn+1 after programming WLn, the amount of compensation may depend on how much programming the adjacent memory cell on WLn+1 received after programming of the target memory cell was complete. For example, if the fine pass of the foggy-fine programming depicted in FIG. 8 is performed on WLn+1 after completing the fine pass to WLn, then the amount of compensation for NWI may depend on whether the adjacent memory cell on WLn+1 was programmed to an even state (e.g., S0, S2, etc.) or an odd state (e.g., S1, S3, etc.). In an embodiment, greater compensation is used if the adjacent memory cell on WLn+1 was programmed to an odd state. This is because, with reference to FIG. 8, the Vt of the adjacent memory cell is increased by more in the fine state for the odd state cells than for the even state cells. In other words, the odd state cells receive more programming in the fine phase.

With reference again to FIG. 11, the adjacent memory cell connected to WLn−1 has its programming completed prior to finishing programming of the target memory cell. Hence, the NWI is much less of a concern as far as its impact on the target memory cell. However, the impact of lateral DR from the adjacent memory cell on WLn−1 on the target memory cell is significant. One possible explanation for lateral DR is that it is due, at least in part, to movement of electrons and/or holes in the charge trapping layer 673. FIG. 11 depicts and an example of possible electron movement and possible hole movement in charge trapping layer 673. The double sided arrows represent possible movement in the lateral direction. The direction of movement may depend on the amount of charge stored in the target cell and the adjacent cell on WLn−1. Note that this charge movement may occur over relatively long periods of time. Hence, this is referred as a data retention (DR) issue.

In some embodiments, compensation for lateral DR is achieved by applying a suitable read reference voltage to WLn when reading target cells on WLn. Since, lateral DR may arise due, at least in part, to the amount of charge stored on the adjacent memory cell on WLn−1, the amount of lateral DR compensation may directly depend on how much charge is stored on the adjacent memory cell on WLn−1. However, note that applying the suitable read reference voltage to WLn may mitigate other types of adjacent cell interference. Hence, the compensation applied to WLn is not limited to compensating for lateral DR.

Figure 12A:
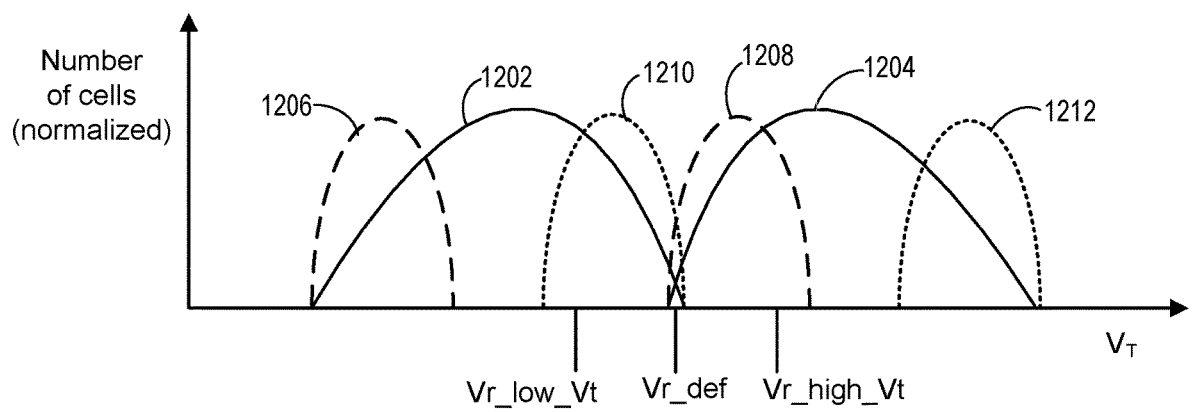
FIG. 12A depicts Vt distributions to illustrate impacts of lateral DR.

FIG. 12A depicts Vt distributions to illustrate impacts of lateral DR. Distributions 1202 and 1204 are the Vt distributions for two data states. For purpose of discussion, these will be referred to as "state i" and "state i+1". These may be, for example, states S6 and S7. In particular, Vt distribution 1202 represents the entire cell population for data state i, whereas Vt distribution 1204 represents the entire cell population for data state i+1. For purpose of discussion, the memory cells are connected to the target word line (WLn).

Vt distributions 1206 and 1208 represent Vt distributions for target cells having an adjacent cell on WLn−1 that is in the erased state (e.g., S0). In particular, Vt distribution 1206 represents those cells from Vt distribution 1202 having an adjacent cell on WLn in the erased state. Likewise, Vt distribution 1208 represents those cells from Vt distribution 1204 having an adjacent cell on WLn in the erased state. Thus, in this example, having an adjacent cell in the erased state may effectively pull down the Vt of the target cell. With reference again to FIG. 11, this change may be due to either electrons moving away from the target cell towards the adjacent cell on WLn−1 or holes moving away from the adjacent cell on WLn−1 towards the target cell. This effect is not limited to adjacent cells being in the low Vt state of the erase state.

Vt distributions 1210 and 1212 represent Vt distributions for target cells having an adjacent cell on WLn−1 that is in the highest Vt state (e.g., S15). In particular, Vt distribution 1210 represents those target cells from Vt distribution 1202 having an adjacent cell on WLn in the highest Vt state. Likewise, Vt distribution 1212 represents those target cells from Vt distribution 1204 having an adjacent cell on WLn in the highest Vt state. Thus, in this example, having an adjacent cell in the highest Vt state may effectively pull up the Vt of the target cell. With reference again to FIG. 11, this change may be due to either electrons moving away from the adjacent cell on WLn−1 towards the target cell or holes moving away from the target cell towards the adjacent cell on WLn−1. This effect is not limited to adjacent cells being in the highest Vt state (e.g., S15). Note that the scale for the horizontal axis is a log scale. Also, note that the number of cells for Vt distributions 1206, 1208, 1210, and 1212 is normalized such that the peaks of each distribution 1202-1212 is the same.

Several read reference voltages are depicted on the horizontal (Vt) axis. A default read reference voltage Vr_def is depicted between the distributions 1202 and 1204. A low Vt read reference voltage Vr_low_Vt is depicted between the distributions 1206 and 1208. A high Vt read reference voltage Vr_high_Vt is depicted between the distributions 1210 and 1212. In one embodiment, if the adjacent cell on WLn−1 has a low Vt, then Vr_low_Vt is used to read the target cell. If the adjacent cell on WLn−1 has a high Vt, then Vr_high_Vt is used to read the target cell. If a read were to be performed using Vr_def, the BER would be higher than using the other read reference voltages. The definition of a low Vt and high Vt is flexible. In one embodiment, the adjacent cells are read at one bit of resolution, with the low Vt being the lowest half of the data states and the high Vt being the highest half of the data states. If each cell stores four bits, the low Vt may be S0-S7 and the high Vt may be S8-S15.

In one embodiment, the adjacent cells are read at two bits of resolution, in which case four read reference voltages may be used. If each cell stores four bits, the two bits may be used to divide the cells into four groups: S0-S3, S4-S7, S8-S11, and S12-S15. In one embodiment, the adjacent cells are read at three bits of resolution, in which case eight read reference voltages may be used. If each cell stores four bits, the three bits may be used to divide the cells into eight groups: S0-S1, S2-S3, S4-S5, S6-S7, S8-S9, S10-S11, S12-S13 and S14-S15.

Figure 12B:
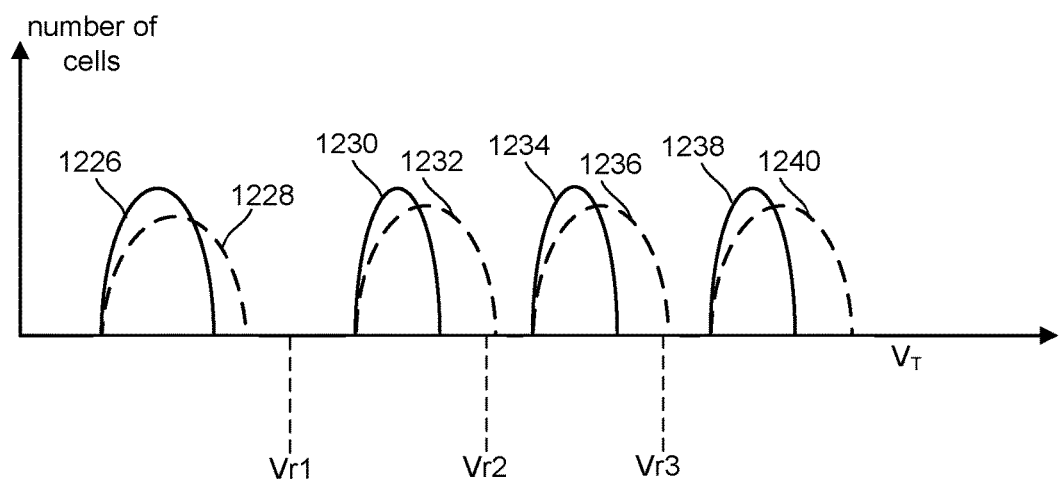
FIG. 12B shows the Vt distributions for memory cells in order to further explain NWI.

FIG. 12B shows the Vt distributions for memory cells in order to further explain NWI. The example is for a case in which memory cells store two bits per cell. The solid curves 1226, 1230, 1234, 1238 show the Vt distributions before the adjacent cells on WLn+1 have been programmed. The dashed curves 1228, 1232, 1236, 1240 show the Vt distributions after the adjacent cells on WLn+1 have been programmed. Each distribution may be widened as a result of adding negative charge to the memory cells of the adjacent word line. Because of electrostatic charge coupling, the negative charge of a later programmed memory cell on WLn+1 will raise the apparent Vt of a memory cell on WLn that is on the same NAND string.

Distributions 1230 and 1232 represent the cells of a selected word line WLn in state S1 before and after programming the adjacent word line WLn+1, respectively. Distributions 1234 and 1236 represent the cells of WLn in state S2 before and after programming WLn+1, respectively. Distributions 1238 and 1240 represent the cells of WLn in state S3 after programming WLn+1, respectively. Because the distributions are widened, memory cells may be read incorrectly. Memory cells at the upper end of each distribution can have an apparent Vt above a corresponding read compare point. For example, when applying reference voltage Vr2, certain memory cells programmed to state S1 may not conduct sufficiently because of the shift in their apparent Vt. These cells may incorrectly be read as in state S2, causing read errors.

Thus, the NWI effect occurs due to the asymmetry in the charge environment experience by a cell between the time it was program-verified and the time it is read. More particularly, during programming of cells on the word line WLn, at least some of the memory cells on WLn+1 are not yet fully programmed and have significantly less charge than they will when fully programmed. Thus, the cells in WLn are programmed verified under such an environment. Later, the cells on WLn+1 are programmed and now some of their charge storage elements are programmed with more negative charges. These negative charges now present a more negative charge environment when the cells on WLn are read. The effect is as if a cell on WLn is programmed with more negative charge; i.e., the cell appears to be programmed with a higher Vt.

In one embodiment, compensation for the NWI is provided based on read pass voltages applied WLn+1, when reading WLn. Thus, the NWI compensation takes into account the condition of the adjacent memory cell on WLn+1. A compensation is effected by biasing the adjacent word line WLn+1 such that the resultant coupling offsets the effects of programming WLn+1, reducing or eliminating errors during reading the selected word line WLn.

Figure 13:
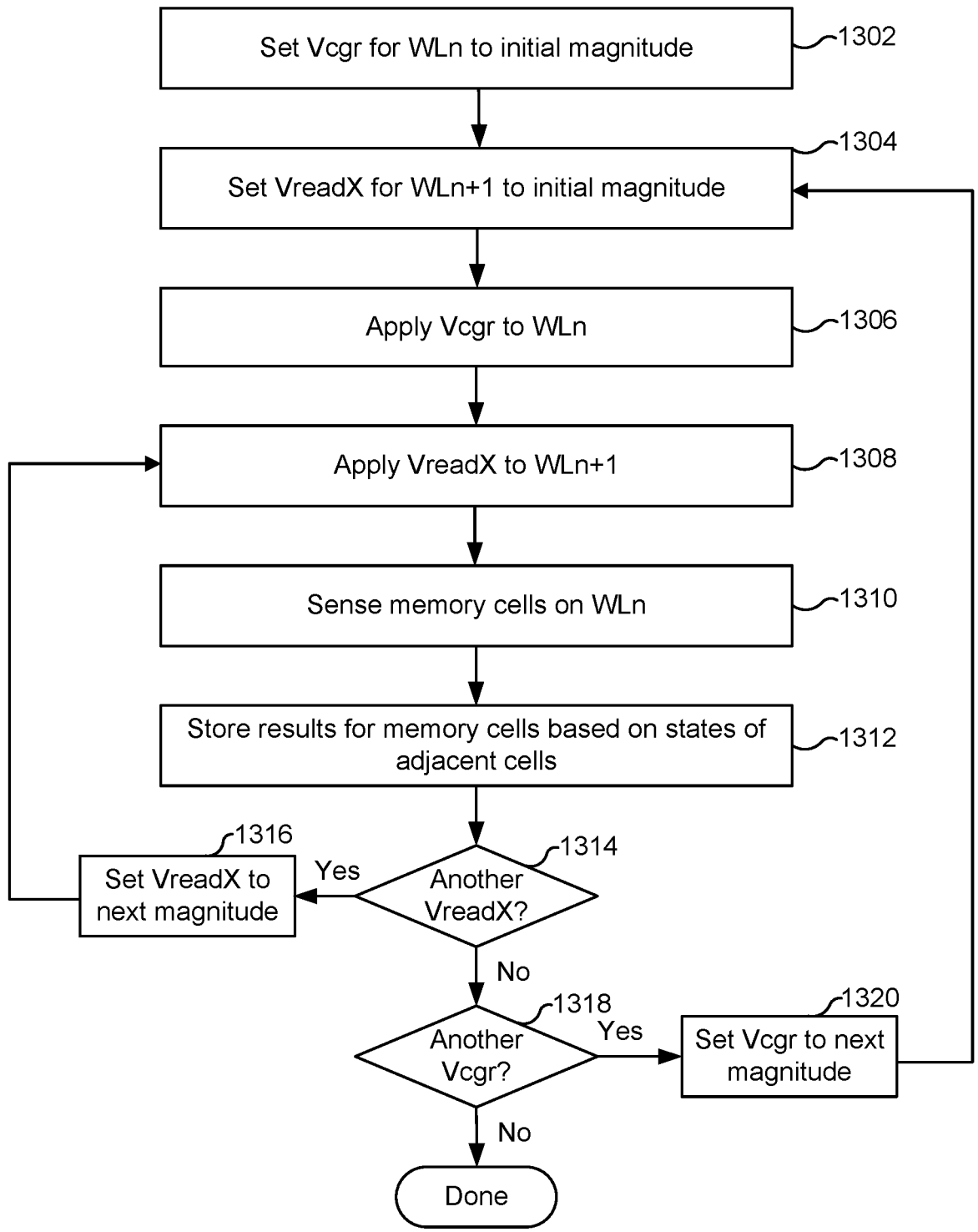
FIG. 13 depicts one embodiment of a flowchart of a process of two-sided adjacent memory cell interference mitigation.

FIG. 13 depicts one embodiment of a flowchart of a process 1300 of two-sided adjacent memory cell interference mitigation. In some embodiments, the memory cells are on NAND strings, with the target cells being those selected to read. For a target cell on a given NAND string, interference from adjacent cells on the NAND string is mitigated. In one embodiment, the process 1300 is used to compensate for NWI on one side (e.g., WLn+1) of the target cells and lateral DR on another side (e.g., WLn−1) of the target cells. However, process 1300 is not limited to compensating for NWI on one side of the target cells and lateral DR on another side of the target cells. In other words, process 1300 may mitigate other types of adjacent memory cell interference. Process 1300 may be performed by a control circuit, which may include one or more of, control circuitry 310, read/write circuits 328, and/or memory controller 102. In some embodiments, process 1300 is initiated after a failure to decode data stored in the target cells. However, process 1300 could be initiated proactively (i.e., prior to a decoding failure) in cases in which the expected BER is high.

Step 1302 includes setting a read reference voltage (Vcgr) to an initial magnitude. The read reference voltage will be applied to a target word line (WLn). This read reference voltage is used to distinguish between two data states. For example, Vcgr could be one of any of Vr1-Vr15 (see FIG. 9). Note that process 1300 covers reading at one read reference level. Process 1300 may be repeated for other read reference levels. The magnitude of Vcgr will be varied during process 1300 to provide differing amount of compensation for lateral DR due to memory cells on an adjacent word line. For the sake of illustration, WLn−1 will be referred to as the adjacent word line having the memory cells that cause lateral DR issues.

Step 1304 includes setting a read pass voltage (VreadX) for an adjacent word line to an initial magnitude. The magnitude of VreadX will be varied during process 1300 to provide differing amount of compensation for NWI due to memory cells on the adjacent word line. For the sake of illustration, WLn+1 will be referred to as the adjacent word line to which VreadX is applied. Note that in process 1300 an assumption is made that WL programming order is sequentially from lower to higher numbered word lines. Hence, WLn+1 is programmed after WLn. In another embodiment, the WL programming order is reversed (from higher to lower numbered word lines), in which case VreadX is applied to WLn−1. Moreover, in the event that the WL programming order is reversed, then the magnitude of Vcgr is selected to compensate for lateral DR due to memory cells on WLn+1.

Step 1306 includes applying Vcgr to WLn, which is the word line connected to target memory cells to be read. Step 1308 includes applying VreadX to WLn+1. Note that other read pass voltages are typically applied to other unselected word lines. Also note that VreadX is applied to WLn+1 while Vcgr is applied to WLn.

Step 1310 includes sensing memory cells connected to WLn. The sensing occurs while VreadX is applied to WLn+1 and while Vcgr is applied to WLn. In some embodiments, all of the memory cells on WLn are sensed in step 1310, although as described in step 1312 the results for some memory cells may be discarded. In the event that the sensing results would be discarded in step 1312, one option is to simply skip the sensing of those cells in step 1310.

Step 1312 includes storing results for memory cells based on data states of adjacent memory cells. In some embodiments, the relevant adjacent cells for each target cell are the two cells that are immediate neighbors on the same NAND string. Step 1312 will be performed a number of times, with different combinations of Vcgr and VreadX being applied to WLn and WLn+1, respectively. The sensing results associated with one combination of Vcgr and VreadX are stored (e.g., stored in latches) for each target cell at some point during process 1300.

Prior to process 1300 information about the states of the adjacent cells may be recorded (e.g., stored in latches or some other storage). For example, for each target cell first state information for an adjacent cell on WLn−1 and second state information for an adjacent cell on WLn+1 may be recorded. This state information need not specify the exact state, but could be recorded at a lower resolution. For example, if the cells store four-bits per cell, the state information could be one-bit, two-bits, three-bits, or four-bits for each adjacent cell. This state information may be used to determine what combination of Vcgr and VreadX is relevant for each target cell.

Step 1314 includes a determination of whether there is another VreadX to be applied to WLn+1. If so, then VreadX is set to the next magnitude in step 1316. Then, VreadX is applied to WLn+1 in step 1308. Note that the voltage at WLn may remain unchanged. Next, steps 1310 and 1312 are performed to sense the cells and store the results based on states of adjacent cells.

Step 1314 is another determination of whether there is another VreadX to apply to WLn+1. Assuming, that there is not, then step 1318 includes a determination of whether there is another Vcgr to apply to WLn. If so, the Vcgr is set to the next magnitude in step 1320. Then, control passes to step 1304, in which VreadX is again set to the initial magnitude. Next, steps 1306-1314 are performed again, as described above, but with the updated magnitude of Vcgr. Hence, multiple values of VreadX may be applied to WLn+1 with the updated magnitude of Vcgr. After all value for VreadX have been applied to WLn+1 for the updated magnitude of Vcgr, step 1318 includes a determination of whether there are any more values for Vcgr to apply to WLn. If so, steps 1304-1314 are performed again. If not, then the process concludes.

Prior to performing process 1300, the adjacent memory cells are read to determine information about the states of the adjacent cells. It is not required that the specific data state be determined. For example, if memory cells store four bits each, it may be sufficient to determine whether a cell has a low Vt (e.g., S0-S7) or a high Vt (e.g., S8-S15).

Figure 14:
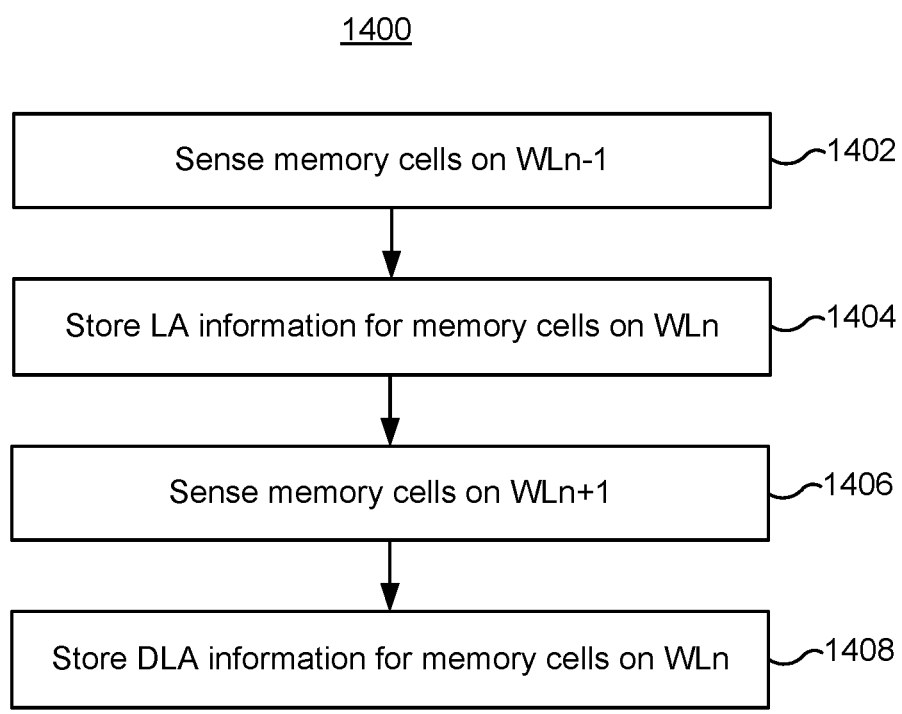
FIG. 14 depicts one embodiment of a process of sensing adjacent memory cells and storing state information.

FIG. 14 depicts one embodiment of a process 1400 of sensing adjacent memory cells and storing state information. The process 1400 may be performed prior to process 1300, such that the state information may be used in step 1312. Step 1402 includes sensing memory cells on WLn−1. In some embodiments, process 1400 is performed in response to a failure to decode data stored in the target WL. However, the LA information and/or the DLA information that is stored in process 1400 could be stored without being triggered by such a decoding failure.

Step 1402 includes sensing memory cells on WLn−1. In step 1402, the cells may be sensed at the same "resolution" as the data stored therein or at a lower resolution. An example in which the memory cells stored four bit per cell will be discussed for illustration. With reference to FIG. 9, the memory cells could be sensed at Vr8 for one bit of resolution. As another example, the memory cells could be sensed at Vr4, Vr8, and Vr12 for two bits of resolution. As another example, the memory cells could be sensed at Vr2, Vr4, Vr6, Vr8, Vr10, Vr12 and Vr14 for three bits of resolution. As another example, the memory cells could be sensed at each of Vr1-Vr15 for four bits of resolution.

Step 1404 includes storing "LA information". The LA information is used for compensation for interference (e.g., lateral DR) from memory cells on WLn−1 on memory cells on WLn. This LA information will be used to determine what Vcgr should be used for each respective target cell on WLn. Recall that in process 1300, each Vcgr is applied to WLn, with the sensing results for the combination of one Vcgr and one VreadX recorded for each target cell. The LA information has one or more bits of resolution, in accordance with the sensing of step 1402.

Step 1406 includes sensing memory cells on WLn+1. The cells may be sensed at the same "resolution" as the data stored therein or at a lower resolution. The cells on WLn+1 may be sensed at the same or a different resolution than those on WLn−1 (in step 1402).

Step 1408 includes storing "DLA information". The DLA information is used for compensation for interference (e.g., NWI) from memory cells on WLn+1 on memory cells on WLn. This DLA information will be used to determine what VreadX should be used for each respective target cell on WLn. In process 1300, each VreadX is applied to WLn+1, with the sensing results for one Vcgr and on VreadX recorded for each target cell.

The following examples will be used to illustrate what DLA information might be stored for two different programming schemes. With reference to FIG. 9, the fine phase of programming may be performed on WLn+1 after programming of WLn is complete. Hence, the DLA information may specify the memory cells on WLn+1 whose charge was increased the most in the fine phase. With reference to FIG. 9, this will be the memory cells in the odd states (S1, S3, S5, etc.). Hence, for one bit resolution, the DLA information may specify whether the adjacent cell on a given NAND string is programmed to either an odd or even state. With reference to the three phase programming scheme in FIG. 8B, the memory cells that received the most programming in the third phase are those in the odd states (S1, S3, S5, S7). Hence, for one bit resolution, the DLA information may specify whether the adjacent cell on a given NAND string is programmed to either an odd or even state. The division for one-bit DLA will not always necessarily be between odd and even states. As noted herein, in some embodiments, the division is based on the amount of charge added to the adjacent cell after programming is complete on the target cell.

In process 1400, the LA information and the DLA information may be stored at one-bit resolution or multi-bit resolution. The LA information and the DLA information can be stored at the same resolution as each other, or different resolutions. In one embodiment, the DLA information is stored at one-bit resolution, and the LA information is stored at multi-bit resolution.

Figure 15:
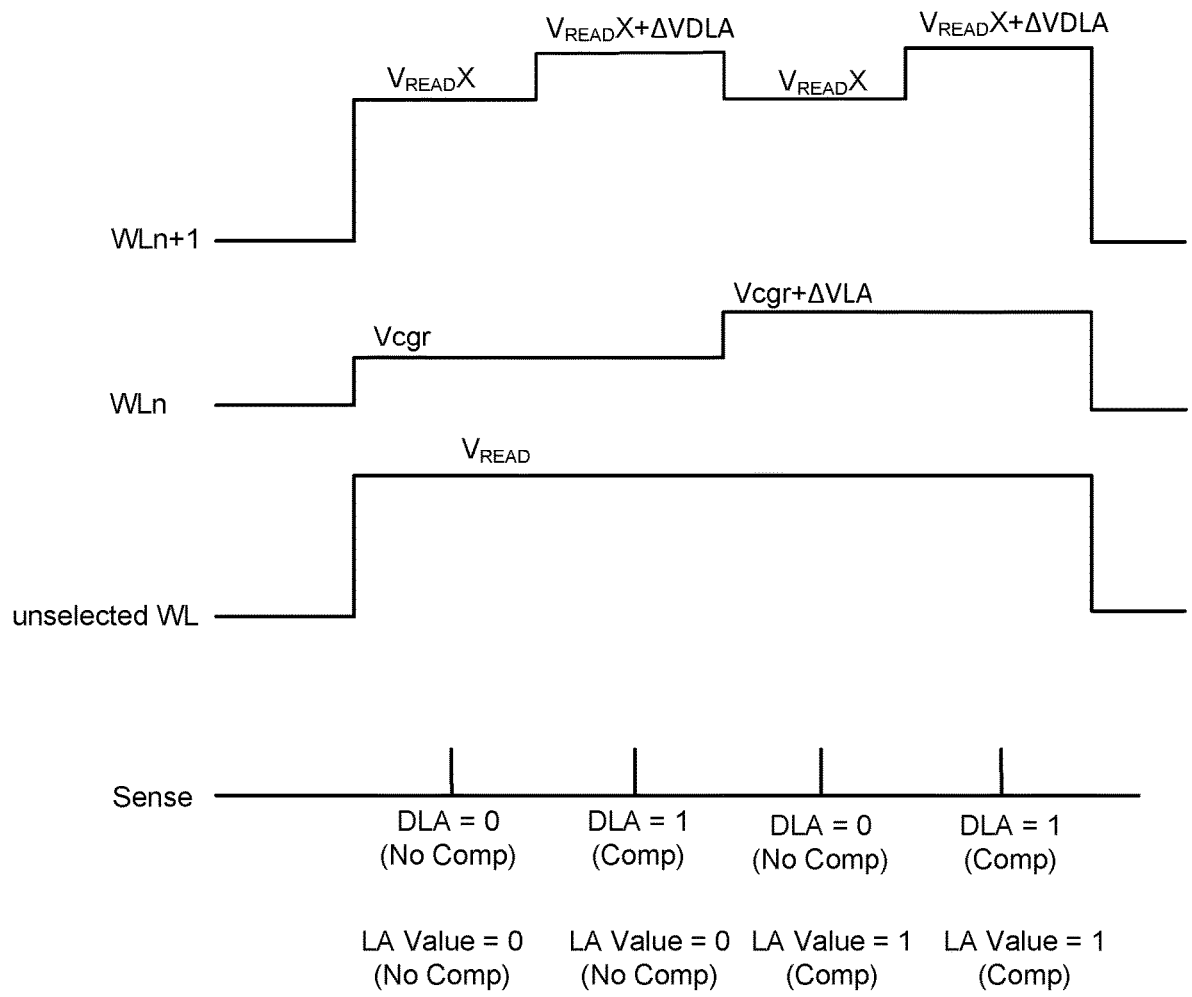
FIG. 15 depicts timing diagrams of voltages applied to word lines in one embodiment of process.

FIG. 15 depicts timing diagrams of voltages applied to word lines in one embodiment of process 1300. There are four combinations of Vcgr and VreadX. WLn+1 receives either VreadX or VreadX+ΔVDLA. In one embodiment, VreadX is a nominal read pass voltage that does not provide compensation. In one embodiment, the nominal read pass voltage that does not provide compensation has the same magnitude of the read pass voltage used during program verify. Compensation for NWI may be provided by adding ΔVDLA to VreadX. In some embodiments, when VreadX+ΔVDLA is applied to WLn+1 the Vt of memory cells on WLn will appear lower (relative to applying VreadX to WLn+1). WLn receives either Vcgr or Vcgr+ΔVLA. In one embodiment, Vcgr is a nominal read pass voltage that does not provide compensation. Compensation for lateral DR may be provided by adding ΔVLA to Vcgr. Other unselected word lines receive Vread, which does not provide compensation for adjacent cell interference.

The memory cells are sensed at times depicted on the line labeled "Sense". Thus, the memory cells are sensed once for each combination of VreadX and Vcgr. The first time that the memory cells are sensed (corresponding to Vcgr, VreadX), no DLA compensation and no LA compensation is provided. The second time that the memory cells are sensed (corresponding to Vcgr, VreadX+ΔVDLA), DLA compensation is provided, but no LA compensation is provided. The third time that the memory cells are sensed (corresponding to Vcgr+ΔVLA, VreadX), no DLA compensation is provided, but LA compensation is provided. The fourth time that the memory cells are sensed (corresponding to Vcgr+ΔVLA, VreadX+ΔVDLA), both DLA compensation and LA compensation are provided.

Figure 16A:
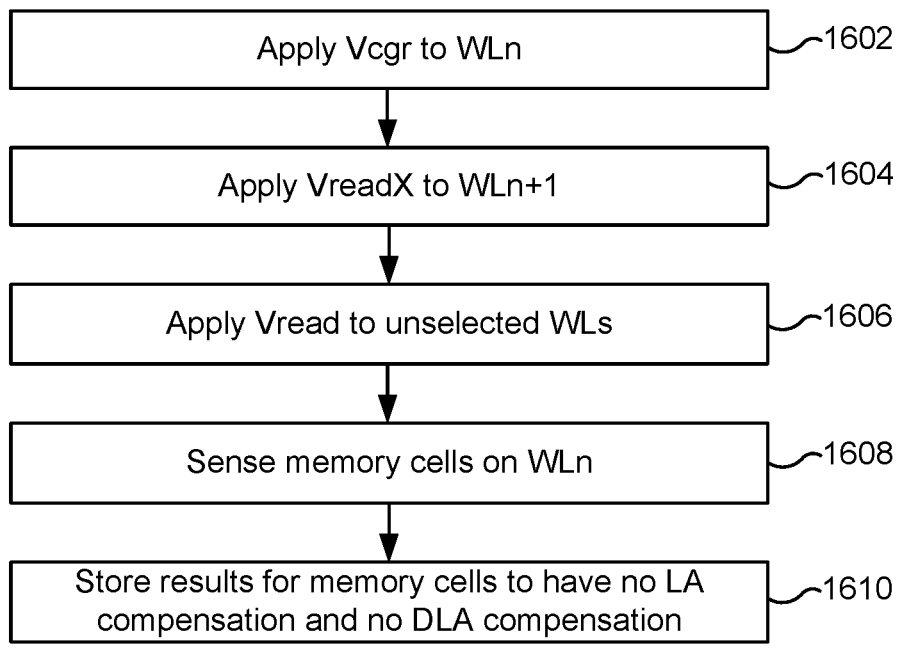
FIGS. 16A-16D are flowcharts of embodiments of that cover the four cases discussed in connection with FIG. 15.

FIGS. 16A-16D are flowcharts of embodiments of that cover the four cases discussed in connection with FIG. 15. FIG. 16A depicts the case in which no DLA compensation and no LA compensation is provided. Step 1602 includes applying Vcgr to WLn. Step 1604 includes applying VreadX to WLn+1. Step 1606 includes applying Vread to other unselected word lines. Step 1608 includes sensing memory cells on WLn. Step 1610 includes storing results for memory cells to not have DLA or LA compensation.

Figure 16B:
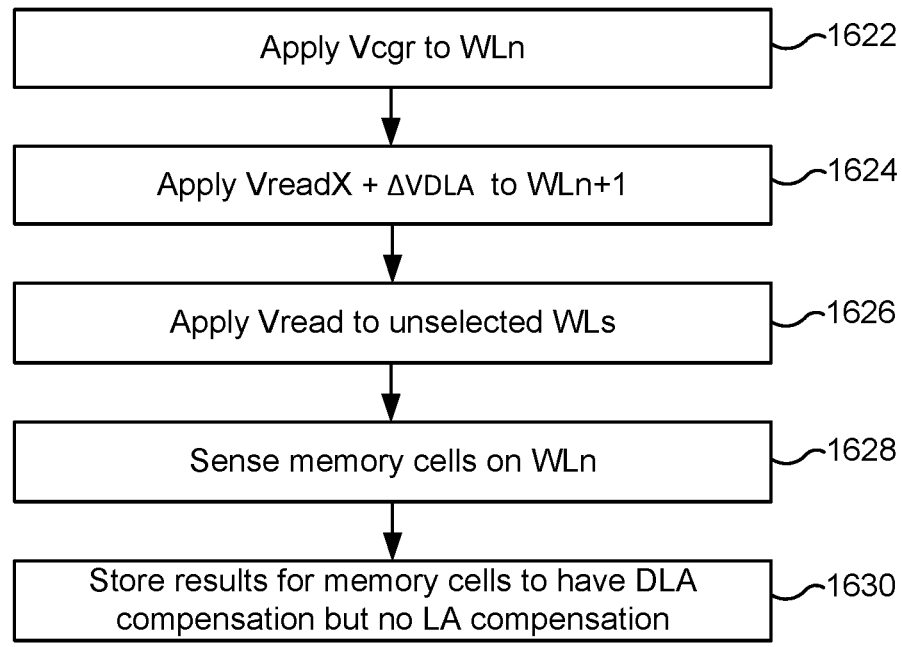

FIG. 16B depicts the case in which DLA compensation is provided, but no LA compensation is provided. Step 1622 includes applying Vcgr to WLn. Step 1624 includes applying VreadX+ΔVDLA to WLn+1. Step 1626 includes applying Vread to other unselected word lines. Step 1628 includes sensing memory cells on WLn. Step 1630 includes storing results for memory cells to have DLA compensation, but to not have LA compensation.

Figure 16C:
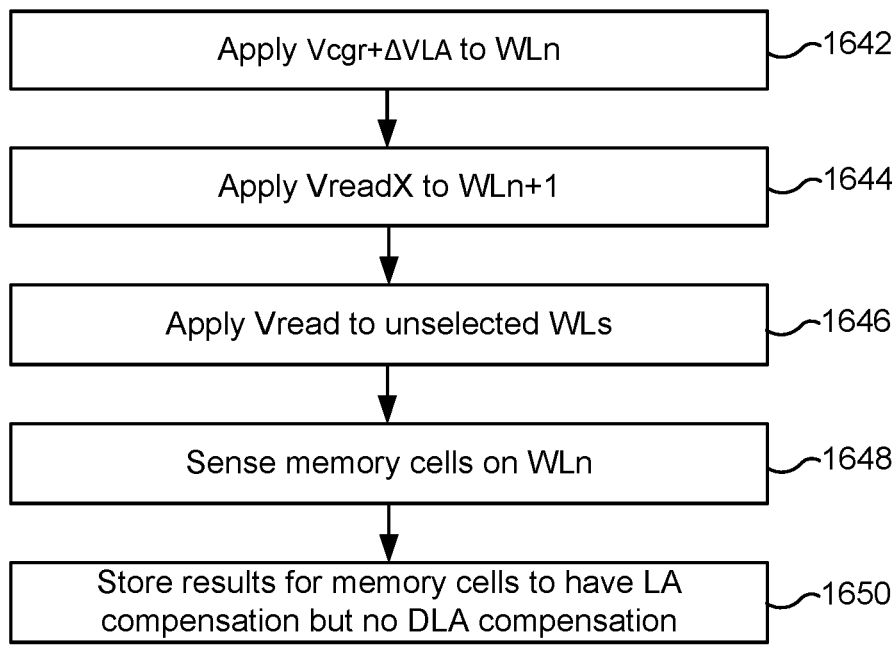

FIG. 16C depicts the case in which DLA compensation is not provided, but LA compensation is provided. Step 1642 includes applying Vcgr+ΔVLA to WLn. Step 1644 includes applying VreadX to WLn+1. Step 1646 includes applying Vread to other unselected word lines. Step 1648 includes sensing memory cells on WLn. Step 1650 includes storing results for memory cells to have no DLA compensation, but to have LA compensation.

Figure 16D:
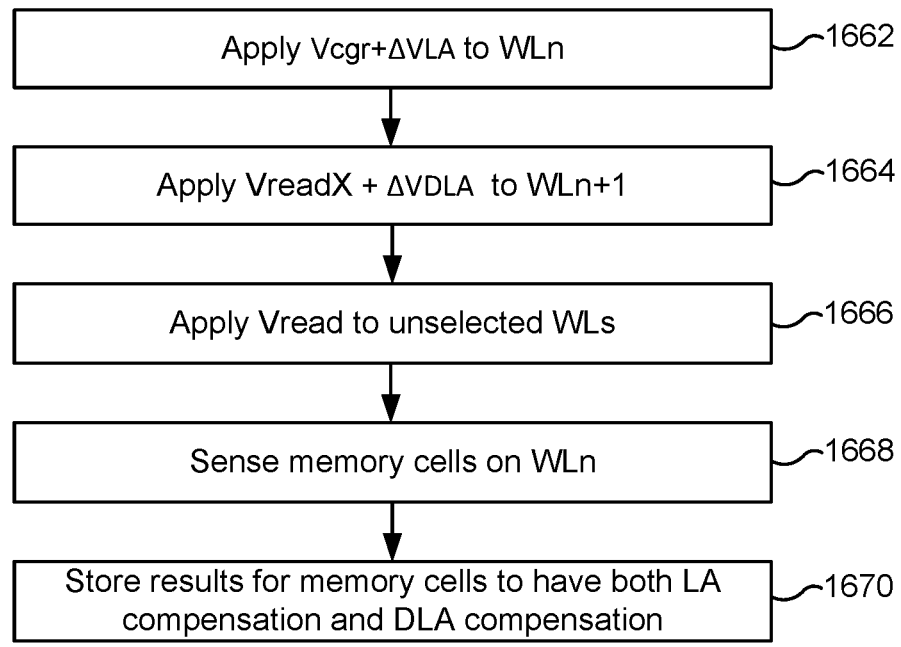

FIG. 16D depicts the case in which both DLA compensation and LA compensation are provided. Step 1662 includes applying Vcgr+ΔVLA to WLn. Step 1664 includes applying VreadX+ΔVDLA to WLn+1. Step 1666 includes applying Vread to other unselected word lines. Step 1668 includes sensing memory cells on WLn. Step 1670 includes storing results for memory cells to have both DLA compensation and LA compensation.

While FIGS. 15 and 16A-16D describe one-bit resolution for both DLA compensation and LA compensation, multi-bit resolution could be used for DLA compensation and/or LA compensation. In one embodiment, multi-bit resolution is used for LA compensation, in which case FIG. 15 would be modified to use, for example, four different magnitudes of the read reference voltage applied to WLn. Consistent with FIG. 15, both values of the read pass voltage (VreadX, VreadX+ΔVDLA) are applied to WLn+1 for each read reference voltage. In this example, the target cells would be sensed eight times, with one of the sensing results being used for each target cell.

In some embodiments, log-likelihood ratios (LLRs) are determined based on sensing memory cells while mitigating for two sided adjacent cell interference. The LLR is a ratio of the probability of the bit being 0 to the probability of the bit being 1. A positive LLR indicates that the bit is estimated to be more likely to be 0 than 1. A negative LLR indicates that the bit is estimated to be more likely to be 1 than 0. The absolute value of the LLR is an indication of a certainty of the estimate.

Figure 17:
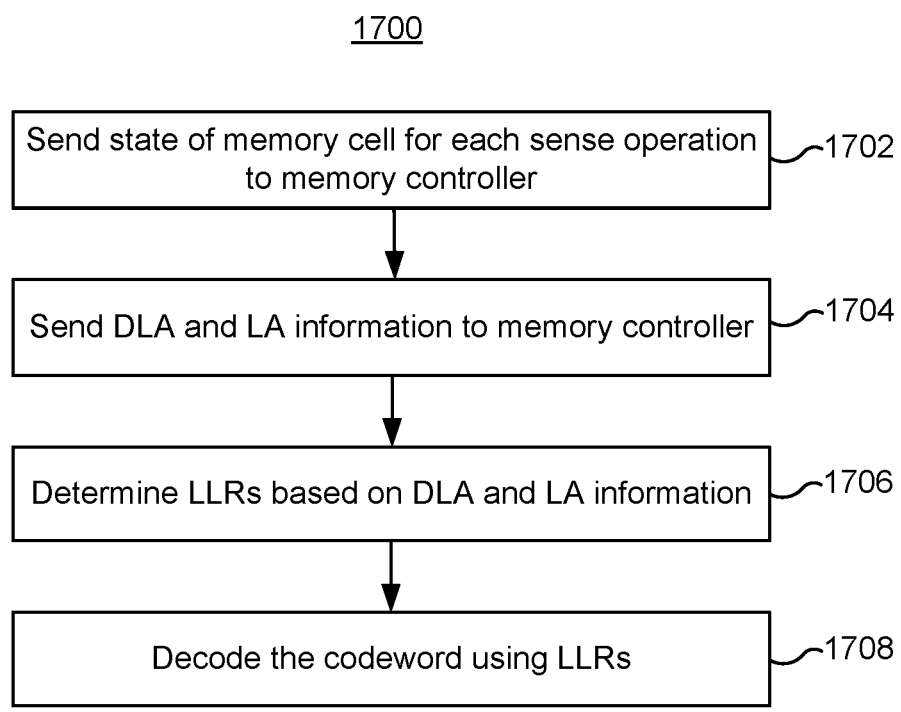
FIG. 17 is a flowchart of one embodiment of a process of determining and using LLRs while mitigating for two sided adjacent cell interference.

The LLRs may be determined for memory cells sensed when compensating for both NWI and lateral DR. FIG. 17 is a flowchart of one embodiment of a process 1700 of determining and using LLRs while mitigating for two sided adjacent cell interference. Prior to performing process 1700, process 1400 may be performed to record LA and DLA information.

Step 1702 includes sending the state of the memory cell for each sense operation to the memory controller 102. Step 1702 may include sensing the target memory cells for various combinations of Vcgr and VreadX, as described herein. The state information may include a bit for each combination of Vcgr and VreadX. Alternatively, it may include multiple bits, representing a quantized version of the cell's Vt, for each combination of Vcgr and VreadX. The group of target memory cells collectively store a codeword.

Step 1704 includes sending the LA information and the DLA information to the memory controller 102. As noted, this information may be collected be performing process 1400.

Step 1706 includes determining LLRs of the bits stored within a cell based on the read cell's state (e.g., its read Vt, or quantized Vt, or Vt bin index) and the LA information and the DLA information. As noted, an LLR is the ratio of the probability of the bit (in the codeword) being 0 to the probability of the bit being 1. As opposed to the embodiment described in process 1300, wherein a specific read result corresponding to one of the Vcgr and VreadX combinations is chosen for each cell (taking a "hard" decision), in process 1700 the different read results per cell (corresponding to the different Vcgr and VreadX combinations) are weighted in a "soft" manner to produce a "soft" LLR metric.

Step 1708 includes decoding the codeword using the LLRs. The LLRs are used as inputs to a soft-decision decoder.

In view of the above, it can be seen that a first embodiment includes an apparatus, comprising a control circuit configured to connect to first non-volatile memory cells connected to a first word line, second non-volatile memory cells connected to a second word line adjacent to the first word line, and third non-volatile memory cells connected to a third word line adjacent to the first word line. The control circuit is configured to apply two or more read reference voltages to the first word line along with two or more read pass voltages to the second word line for each of the two or more read reference voltages, wherein the two or more read reference voltages are associated with the same data state. The control circuit is configured to determine a condition for each respective first memory cell based on sensing the respective first memory cell for a combination of a first voltage from the two or more read reference voltages that depends on a state of an adjacent cell on the third word line and a second voltage from the two or more read pass voltages that depends on a state of an adjacent cell on the second word line.

In a second embodiment, and in furtherance of the first embodiment, the two or more read reference voltages comprise a compensating read reference voltage that compensates for interference to the first memory cells from charge stored on adjacent memory cells connected to the third word line. The two or more read pass voltages comprise a compensating read pass voltage that compensates for interference to the first memory cells from programming adjacent memory cells connected to the second word line. The control circuit applies the compensating read reference voltage to the first word line while the control circuit applies the compensating read pass voltage to the second word line.

In a third embodiment, and in furtherance of the first or second embodiments, the control circuit is further configured to finish programming the second memory cells after finishing programming the first memory cells. At least one voltage in the two or more read pass voltages compensates for interference on the first memory cells caused by finishing the programming of the second memory cells after finishing the programming of the first memory cells.

In a fourth embodiment, and in furtherance of any of the first to third embodiments, the control circuit is further configured to finish programming the first memory cells after finishing programming the third memory cells. The two or more read reference voltages include at least one voltage that compensates for interference on the first memory cells caused by charge stored in the third memory cells.

In a fifth embodiment, and in furtherance of any of the first to fourth embodiments, the control circuit is further configured to sense the third memory cells to determine a state for each third memory cell at a first resolution. Each voltage in the two or more read reference voltages corresponds to a state at the first resolution.

In a sixth embodiment, and in furtherance of the fifth embodiment, the control circuit is further configured to sense the second memory cells to determine a state for each second memory cell at a second resolution. Each voltage in the two or more read pass voltages corresponds to a state at the second resolution.

In a seventh embodiment, and in furtherance of the fifth embodiment, a read reference voltage of the two or more read reference voltages that provides for the most compensation is applied in connection with third memory cells having a highest threshold voltage. A read pass voltage of the two or more read pass voltages that provides for the most compensation is applied in connection with second memory cells that were programmed in a final programming phase.

In an eighth embodiment, and in furtherance of the any of the first to seventh embodiments, the control circuit is further configured to select log-likelihood ratios (LLRs) for decoding a codeword stored in the first memory cells based on the state of an adjacent cell to each respective first memory cell on the third word line and a state of an adjacent cell to each respective first memory cell on the second word line and further based on sensing the first memory cells with the two or more read reference voltages applied to the first word line and with the two or more read pass voltages applied to the second word line. The value that is output for each respective first memory cell is based on decoding the codeword.

In a ninth embodiment, and in furtherance of the any of the first to eighth embodiments, the first, the second, and the third memory cells are arranged as NAND strings. Each NAND string comprises a continuous charge trapping layer. One of the voltages of the two or more read reference voltages compensates for interference on a selected cell of the first memory cells on a selected NAND string from charge stored in the continuous charge trapping layer of a first unselected cell of the third memory cells on the selected NAND string. One of the voltages of the two or more read pass voltages compensates for interference on the selected first memory cell from charge programmed into the continuous charge trapping layer of a second unselected cell of the second memory cells on the selected NAND string.

One embodiment includes a method of operating non-volatile storage. The method comprises applying a read reference voltage to a first word line that compensates for interference to first memory cells connected to the first word line from charge stored on second memory cells on a second word line that is adjacent to a first side of the first word line. The method comprises applying a read pass voltage to a third word line that compensates for interference on the first memory cells from programming third memory cells on the third word line. The third word line is adjacent to a second side of the first word line. The method comprises sensing the first memory cells in response to applying the read reference voltage to the first word line while applying the read pass voltage to the third word line. The method comprises storing results from the sensing for a subset of the first memory cells that receive compensation for interference from charge stored on an adjacent memory cell connected to the second word line and receive compensation for interference from programming an adjacent memory cell connected to the third word line.

One embodiment includes a non-volatile storage system, comprising a plurality of NAND strings comprising non-volatile memory cells, and a control circuit in communication with the NAND strings. The control circuit is configured to apply a read reference voltage to a selected memory cell on a selected NAND string that compensates for interference to the selected memory cell from charge stored on a first unselected memory cell on the selected NAND string that is adjacent to one side of the selected memory cell. The control circuit is configured to apply a read pass voltage to a second unselected memory cell on the selected NAND string that is adjacent to the other side of the selected memory cell while applying the read reference voltage to the selected memory cell, wherein the read pass voltage compensates for interference on the selected memory cell caused by programming the second unselected memory cell. The control circuit is configured to sense the selected memory cell while applying the read reference voltage to the selected memory cell and while applying the read pass voltage to the second unselected memory cell. The control circuit is configured to determine a state of the selected memory cell based on sensing the selected memory cell.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a control circuit configured to connect to first non-volatile memory cells connected to a first word line, second non-volatile memory cells connected to a second word line adjacent to the first word line, and third non-volatile memory cells connected to a third word line adjacent to the first word line, the control circuit configured to:
apply two or more read reference voltages to the first word line along with two or more read pass voltages to the second word line for each of the two or more read reference voltages, wherein the two or more read reference voltages are associated with a same data state; and
determine a condition for each respective first memory cell based on sensing the respective first memory cell for a combination of a first voltage from the two or more read reference voltages that depends on a state of an adjacent cell on the third word line and a second voltage from the two or more read pass voltages that depends on a state of an adjacent cell on the second word line.

2. The apparatus of claim 1, wherein:
the two or more read reference voltages comprise a compensating read reference voltage that compensates for interference to the first memory cells from charge stored on adjacent memory cells connected to the third word line; and
the two or more read pass voltages comprise a compensating read pass voltage that compensates for interference to the first memory cells from programming adjacent memory cells connected to the second word line, wherein the control circuit applies the compensating read reference voltage to the first word line while the control circuit applies the compensating read pass voltage to the second word line.

3. The apparatus of claim 1, wherein the control circuit is further configured to:
finish programming the second memory cells after finishing programming the first memory cells, wherein at least one voltage in the two or more read pass voltages compensates for interference on the first memory cells caused by finishing the programming of the second memory cells after finishing the programming of the first memory cells.

4. The apparatus of claim 1, wherein the control circuit is further configured to:
finish programming the first memory cells after finishing programming the third memory cells, wherein the two or more read reference voltages include at least one voltage that compensates for interference on the first memory cells caused by charge stored in the third memory cells.

5. The apparatus of claim 1, wherein the control circuit is further configured to:
sense the third memory cells to determine a state for each third memory cell at a first resolution, wherein each voltage in the two or more read reference voltages corresponds to a state at the first resolution.

6. The apparatus of claim 5, wherein the control circuit is further configured to:
  sense the second memory cells to determine a state for each second memory cell at a second resolution, wherein each voltage in the two or more read pass voltages corresponds to a state at the second resolution.

7. The apparatus of claim 6, wherein:
  a read reference voltage of the two or more read reference voltages that provides for a greatest amount of compensation is applied in connection with third memory cells having a highest threshold voltage; and
  a read pass voltage of the two or more read pass voltages that provides for a greatest amount of compensation is applied in connection with second memory cells that were programmed in a final programming phase.

8. The apparatus of claim 1, wherein the control circuit is further configured to:
  select log-likelihood ratios (LLRs) for decoding a codeword stored in the first memory cells based on the state of an adjacent cell to each respective first memory cell on the third word line and a state of an adjacent cell to each respective first memory cell on the second word line and further based on sensing the first memory cells with the two or more read reference voltages applied to the first word line and with the two or more read pass voltages applied to the second word line, wherein a value that is output for each respective first memory cell is based on decoding the codeword.

9. The apparatus of claim 1, wherein:
  the first, the second, and the third memory cells are arranged as NAND strings, each NAND string comprising a continuous charge trapping layer;
  one of the voltages of the two or more read reference voltages compensates for interference on a selected cell of the first memory cells on a selected NAND string from charge stored in the continuous charge trapping layer of a first unselected cell of the third memory cells on the selected NAND string; and
  one of the voltages of the two or more read pass voltages compensates for interference on the selected first memory cell from charge programmed into the continuous charge trapping layer of a second unselected cell of the second memory cells on the selected NAND string.

10. A method of operating non-volatile storage, the method comprising:
  applying a read reference voltage to a first word line that compensates for interference to first memory cells connected to the first word line from charge stored on second memory cells on a second word line that is adjacent to a first side of the first word line;
  applying a read pass voltage to a third word line that compensates for interference on the first memory cells from programming third memory cells on the third word line, wherein the third word line is adjacent to a second side of the first word line;
  sensing the first memory cells in response to applying the read reference voltage to the first word line while applying the read pass voltage to the third word line;
  storing results from the sensing for a subset of the first memory cells that receive compensation for interference from charge stored on an adjacent memory cell connected to the second word line and receive compensation for interference from programming an adjacent memory cell connected to the third word line;
  sensing the second memory cells;
  based on sensing the second memory cells, storing first information for each respective first memory cell that specifies whether the respective first memory cell is to receive compensation for interference from an adjacent memory cell connected to the second word line;
  sensing the third memory cells;
  based on sensing the third memory cells, storing second information for each respective first memory cell that specifies whether the respective first memory cell is to receive compensation for interference from an adjacent memory cell connected to the third word line; and
  using the first information and the second information to determine the subset of the first memory cells.

11. The method of claim 10, further comprising:
  verifying that programming of the first memory cells is complete prior to verifying that programming of the third memory cells is complete.

12. The method of claim 11, further comprising:
  verifying that programming of the second memory cells is complete prior to verifying that programming of the first memory cells is complete.

13. The method of claim 10, further comprising:
  performing a first foggy phase of a first foggy-fine programming operation on the first memory cells prior to performing a second foggy phase of a second foggy-fine programming operation on the third memory cells; and
  performing a first fine phase of the first foggy-fine programming operation on the first memory cells prior to performing a second fine phase of the second foggy-fine programming operation on the third memory cells, wherein the read pass voltage applied to the third word line compensates for interference on the first memory cells from performing the second fine phase of the second foggy-fine programming operation on the third memory cells.

14. A non-volatile storage system, comprising:
  a plurality of NAND strings comprising non-volatile memory cells; and
  a control circuit in communication with the NAND strings, the control circuit configured to:
   sense a first unselected memory cell;
   based on sensing the first unselected memory cell, store first information that specifies an amount of compensation a selected memory cell is to receive for interference from the first unselected memory cell;
   sense a second unselected memory cell;
   based on sensing the second unselected memory cell, store second information that specifies an amount of compensation the selected memory cell is to receive for interference from the second unselected memory cell;
   use the first information and the second information to determine a magnitude of a read pass voltage and a magnitude of a read reference voltage for which the selected memory cell should be sensed for determining a data state of the selected memory cell;
   apply the read reference voltage to the selected memory cell on a selected NAND string that compensates for interference to the selected memory cell from charge stored on the first unselected memory cell on the selected NAND string that is adjacent to one side of the selected memory cell;
   apply the read pass voltage to the second unselected memory cell on the selected NAND string that is adjacent to the other side of the selected memory cell while applying the read reference voltage to the selected memory cell, wherein the read pass voltage compensates for interference on the selected memory cell caused by programming the second unselected memory cell;

sense the selected memory cell while applying the read reference voltage to the selected memory cell and while applying the read pass voltage to the second unselected memory cell; and determine the data state of the selected memory cell based on sensing the selected memory cell.

15. The non-volatile storage system of claim 14, wherein the control circuit is further configured to:

program the first unselected memory cell to its final data state; and program the selected memory cell to its final data state after programming the first unselected memory cell to its final data state.

16. The non-volatile storage system of claim 15, wherein the control circuit is further configured to:

program the second unselected memory cell to its final data state after programming the selected memory cell to its final data state.

17. The non-volatile storage system of claim 14, wherein:

the plurality of NAND strings each comprise a charge trapping layer; and the control circuit is configured to program the memory cells by adding charge to the charge trapping layer, wherein the control circuit finishes programming the second unselected memory cell after finishing programming the selected memory cell.

18. The non-volatile storage system of claim 14, wherein the control circuit is further configured to:

select log-likelihood ratios (LLRs) for decoding a codeword stored in selected memory cells of the plurality of NAND strings based on states of first unselected cells of the plurality of NAND strings on one side of selected memory cells and states of second unselected cells of the plurality of NAND strings on the other side of the selected memory cells and based on sensing the selected memory cells while applying the read reference voltage to the selected memory cells and while applying the read pass voltage to the second unselected memory cells.

* * * * *